United States Patent
Rajski et al.

(10) Patent No.: US 8,726,112 B2
(45) Date of Patent: May 13, 2014

(54) SCAN TEST APPLICATION THROUGH HIGH-SPEED SERIAL INPUT/OUTPUTS

(75) Inventors: Janusz Rajski, West Linn, OR (US); Nilanjan Mukherjee, Wilsonville, OR (US); Mark A Kassab, Wilsonville, OR (US); Thomas H. Rinderknecht, Tualatin, OR (US); Mohamed Dessouky, El-Rehab (EG)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 12/506,250

(22) Filed: Jul. 20, 2009

(65) Prior Publication Data

US 2010/0313089 A1 Dec. 9, 2010

Related U.S. Application Data

(60) Provisional application No. 61/082,139, filed on Jul. 18, 2008.

(51) Int. Cl.
   *G01R 31/28* (2006.01)
(52) U.S. Cl.
   USPC .......................................... 714/731; 714/734
(58) Field of Classification Search
   USPC .......................................... 714/724–730, 733
   See application file for complete search history.

(56) References Cited

U.S. PATENT DOCUMENTS

| | | | | |
|---|---|---|---|---|
| 6,249,893 B1 * | 6/2001 | Rajsuman et al. | ............ | 714/741 |
| 6,286,115 B1 * | 9/2001 | Stubbs | ........................ | 714/718 |
| 6,551,844 B1 * | 4/2003 | Eldridge et al. | ................ | 438/14 |
| 6,675,326 B1 * | 1/2004 | Yoshizaki | ........................ | 714/48 |
| 6,968,472 B2 * | 11/2005 | Fernald | ......................... | 713/400 |
| 7,554,858 B2 * | 6/2009 | Gatzemeier et al. | ..... | 365/189.02 |
| 8,072,820 B2 * | 12/2011 | Gatzemeier et al. | ..... | 365/189.02 |
| 8,400,844 B2 * | 3/2013 | Gatzemeier et al. | ..... | 365/189.02 |
| 2008/0010568 A1 * | 1/2008 | Kushnick | ...................... | 714/724 |
| 2008/0052582 A1 * | 2/2008 | Jun et al. | ....................... | 714/733 |
| 2009/0259903 A1 * | 10/2009 | Whetsel | ......................... | 714/729 |
| 2010/0134133 A1 * | 6/2010 | Pagani | ......................... | 324/763 |

OTHER PUBLICATIONS

Athavale and Christensen, "High-Speed Serial I/O Made Simple," Xilinx Connectivity Solutions, Edition 1.0 (Apr. 2005).
Evans, "The New ATE: Protocol Aware," *IEEE Proceedings of Int'l Test Conf.*, Paper 20.1 (2007).
Rajski et al., "Embedded Deterministic Test," *IEEE Trans. on CAD of Integrated Circuits and Systems*, vol. 23(5):776-792 (May 2004).
Xilinx Corp., "Aurora Protocol Specification," SP002 (v.2.0) (Sep. 19, 2007).

* cited by examiner

*Primary Examiner* — Daniel McMahon
(74) *Attorney, Agent, or Firm* — Klarquist Sparkman, LLP

(57) ABSTRACT

Methods and devices for using high-speed serial links for scan testing are disclosed. The methods can work with any scheme of scan data compression or with uncompressed scan testing. The protocol and hardware to support high speed data transfer reside on both the tester and the device under test. Control data may be transferred along with scan data or be partially generated on chip. Clock signals for testing may be generated on chip as well. In various implementations, the SerDes (Serializer/Deserializer) may be shared with other applications. The Aurora Protocol may be used to transport industry standard protocols. To compensate for effects of asynchronous operation of a conventional high-speed serial link, buffers may be used. The high-speed serial interface may use a data conversion block to drive test cores.

44 Claims, 15 Drawing Sheets

PRIOR ART
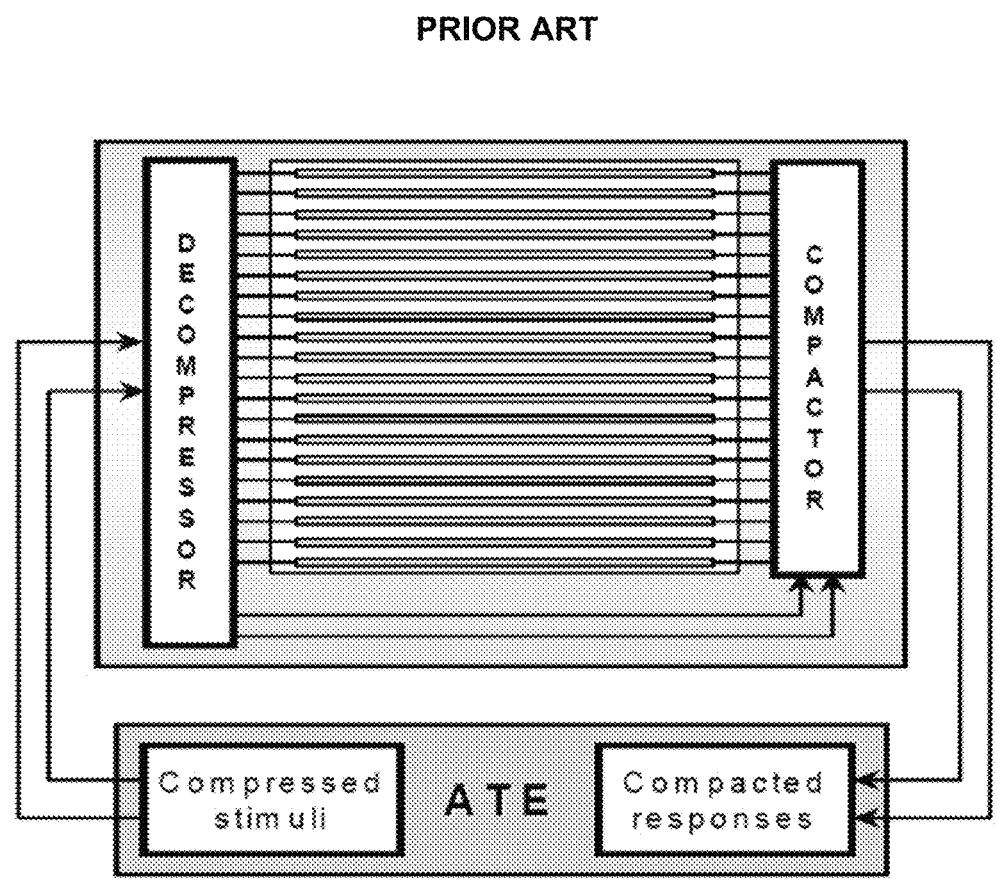
Figure 1: Overall EDT Architecture

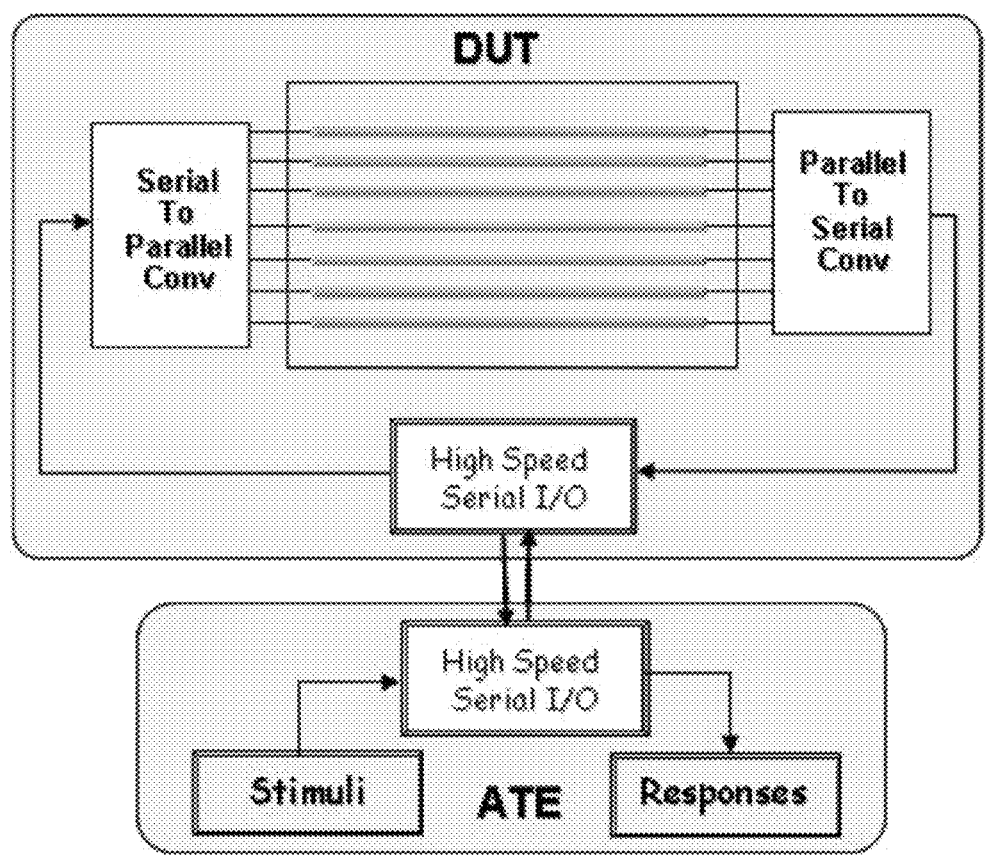
Figure 2: Regular Scan Test Application Using High-Speed I/Os

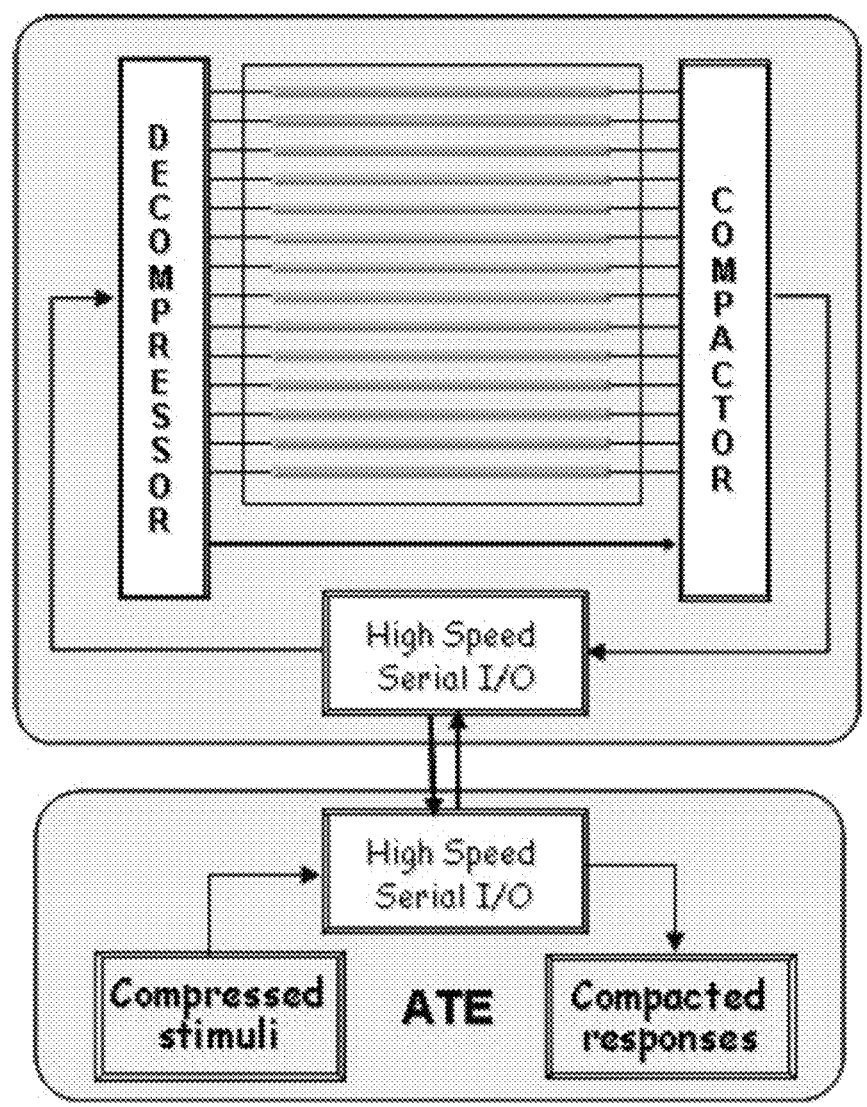
Figure 3: EDT Architecture with High-Speed I/Os

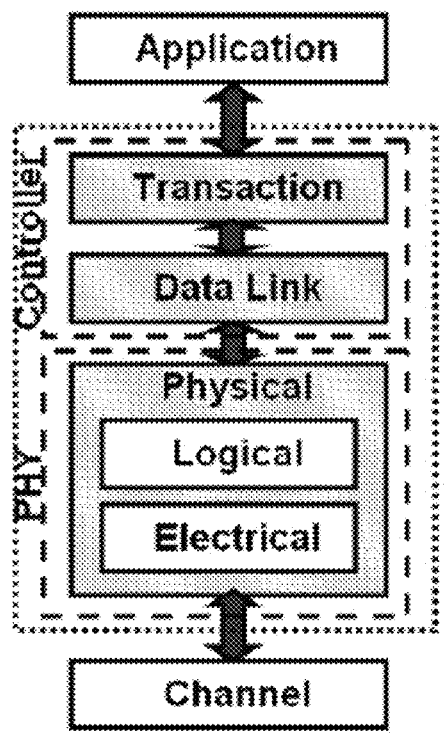
Figure 4: Layered System Architecture
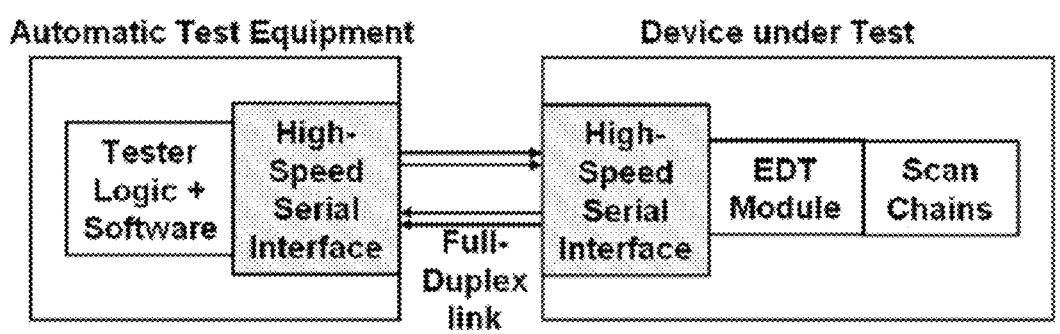
Figure 5: High-Speed Link Transferring Scan Data

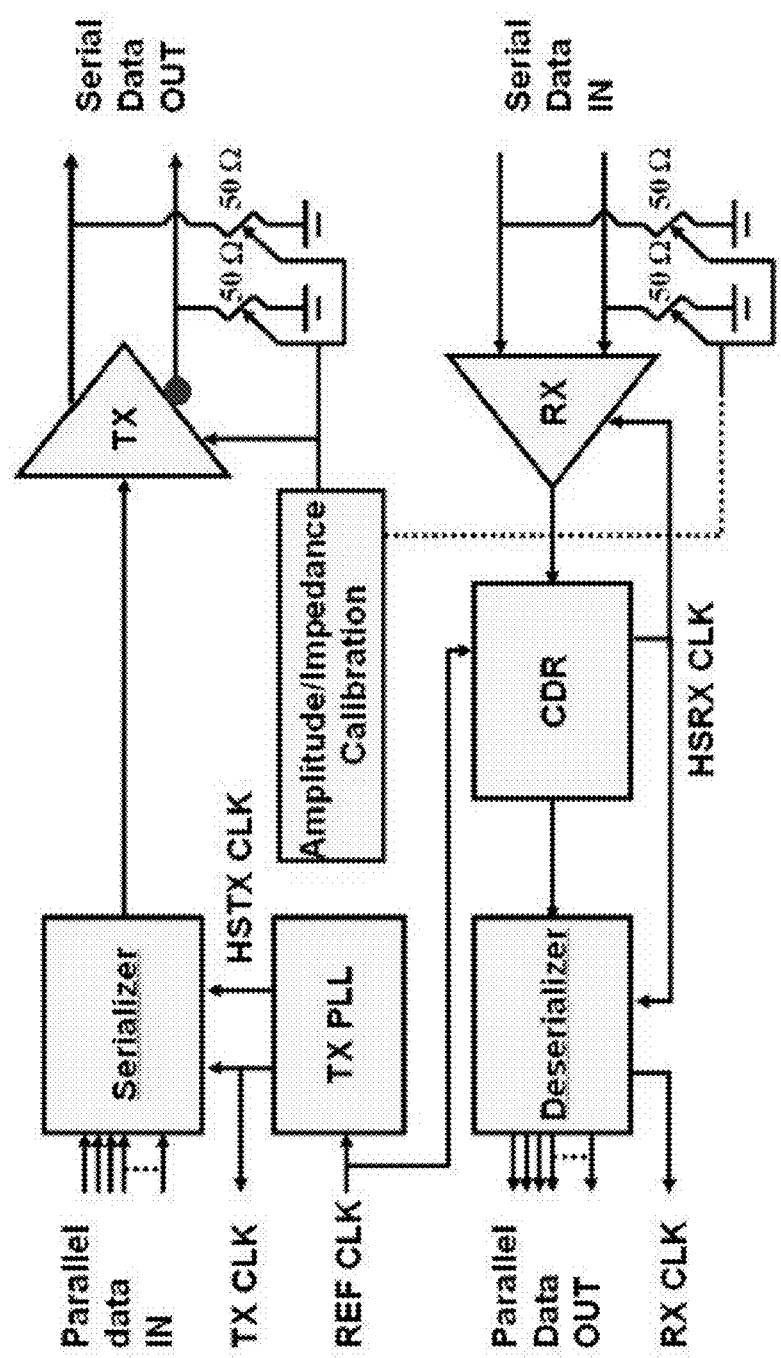
Figure 6: SerDes Architecture

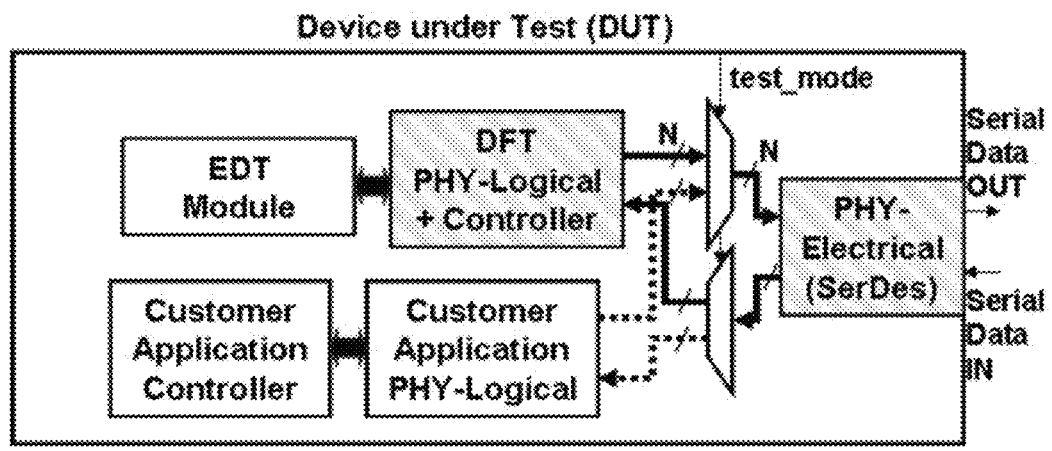
Figure 7: Interception of Test Data in the DUT
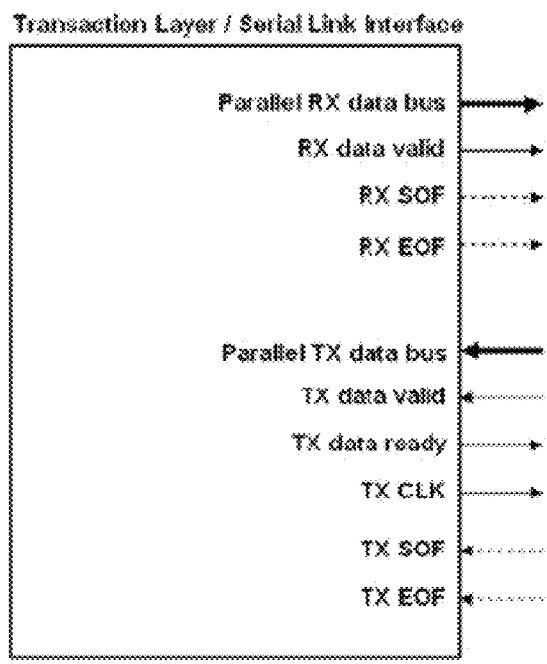
Figure 8: Serial Link Interface

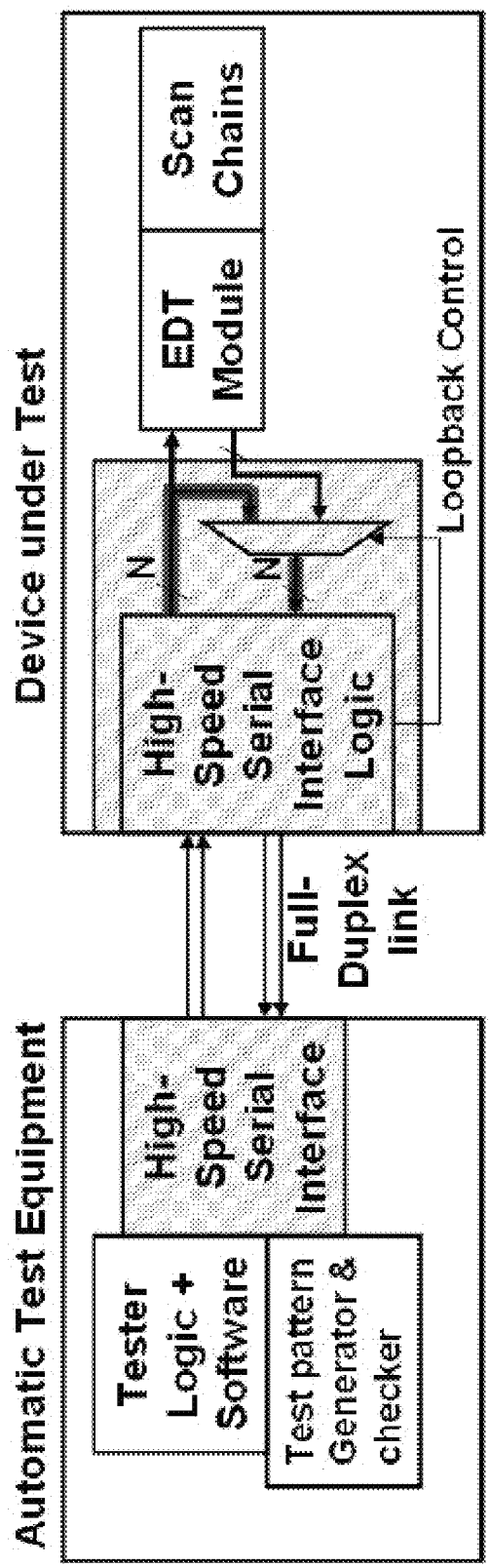
Figure 9: Overview of the Test Setup

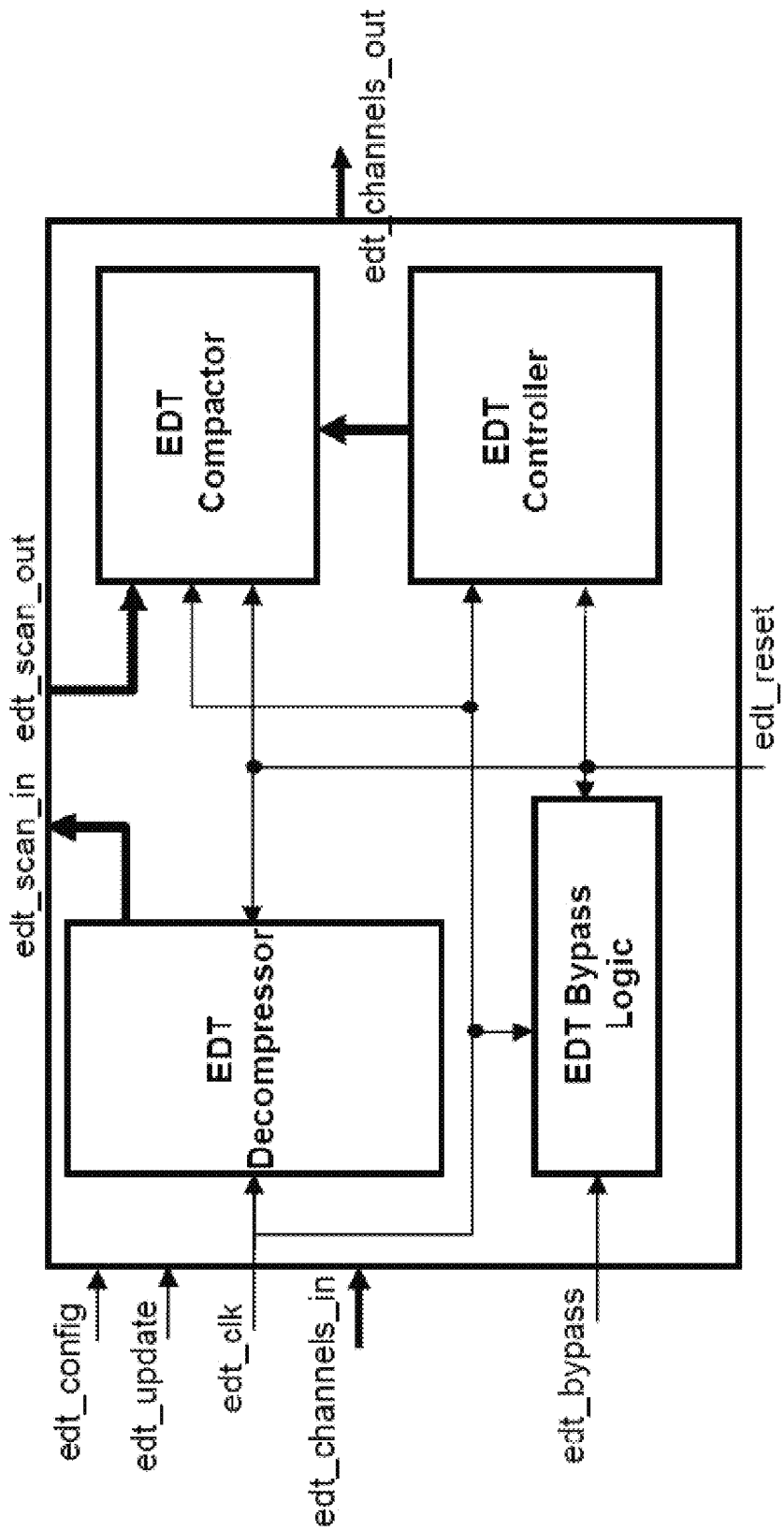
Figure 10: Overview of the EDT Block

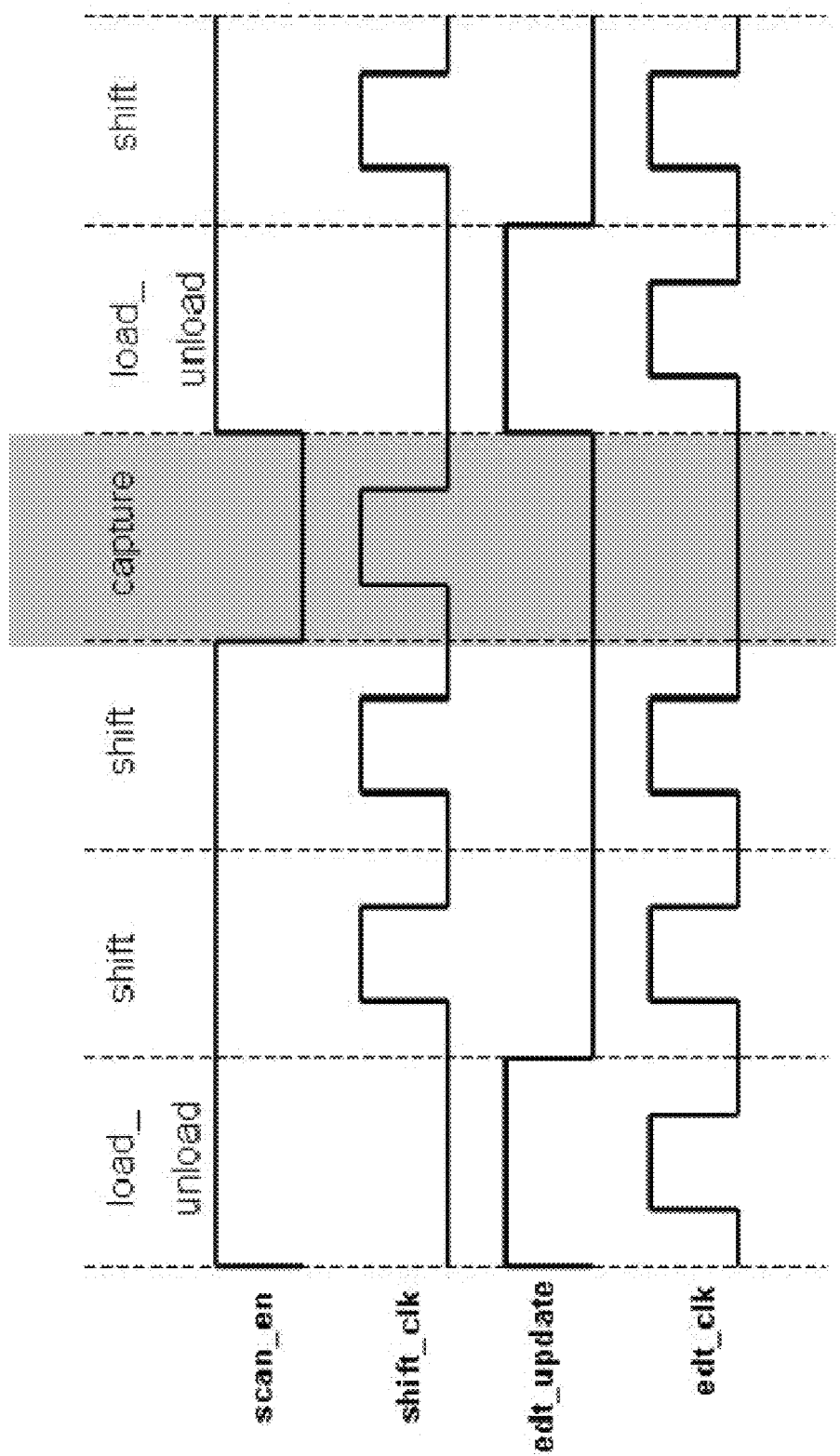
Figure 11: EDT Signals Waveform

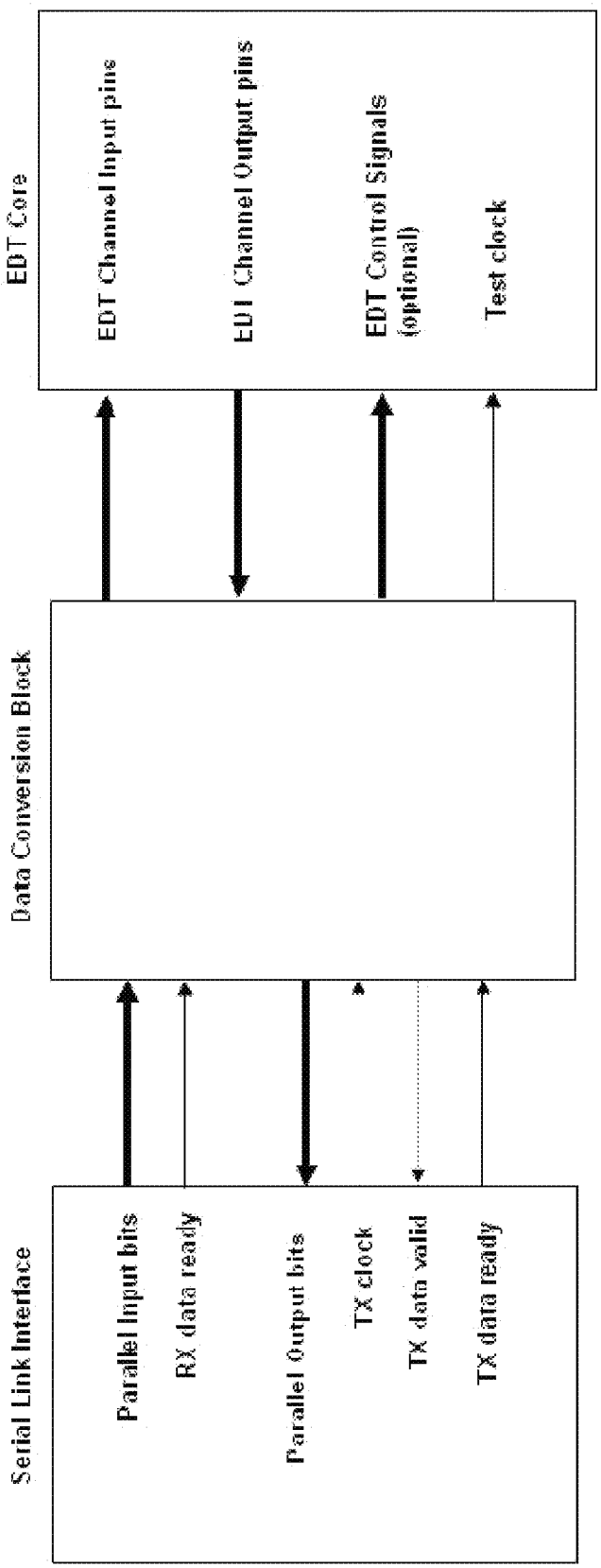
Figure 12: Data Conversion Block

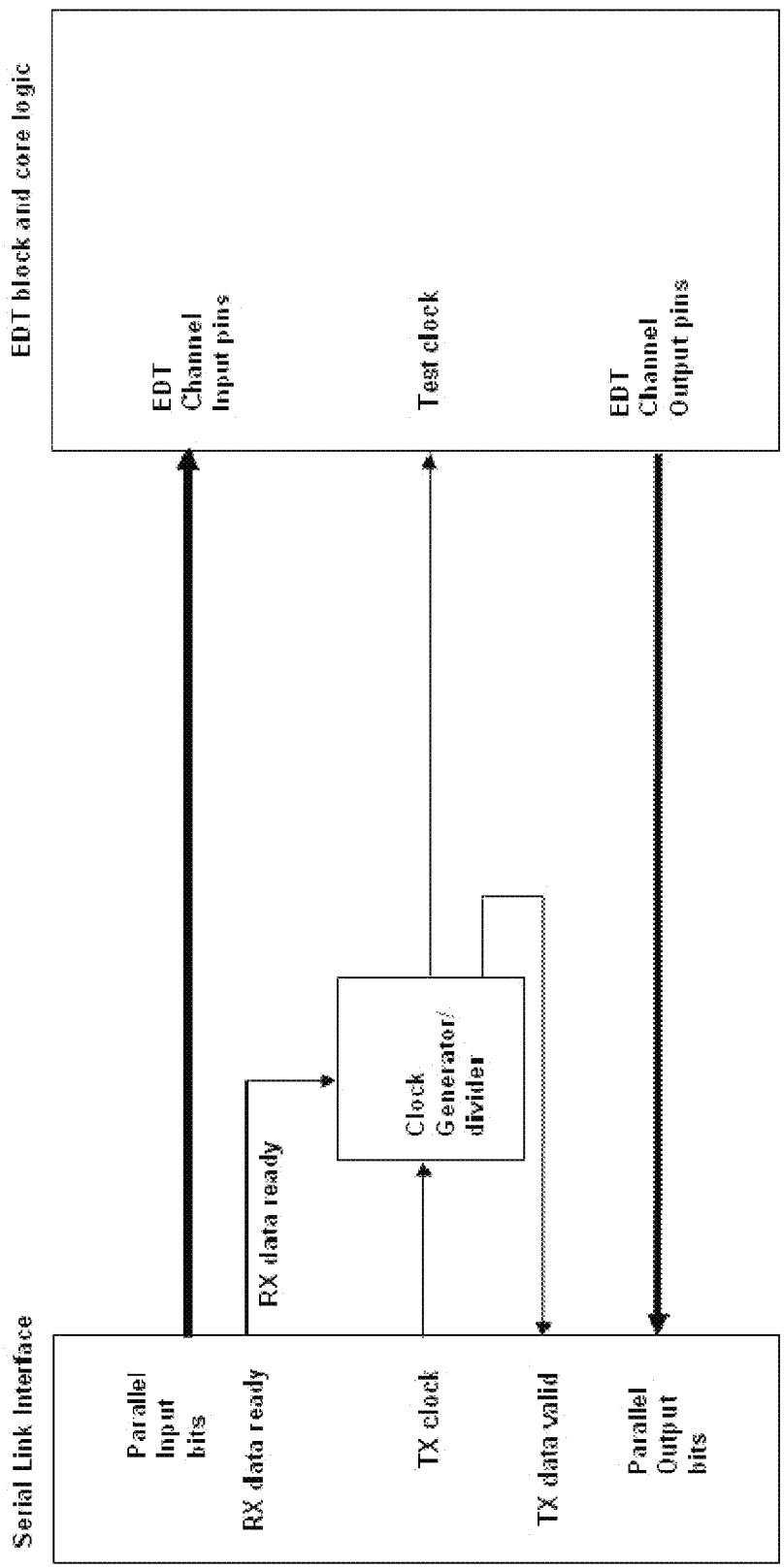
Figure 13: # parallel input bits >= (#EDT channels + #EDT controls)

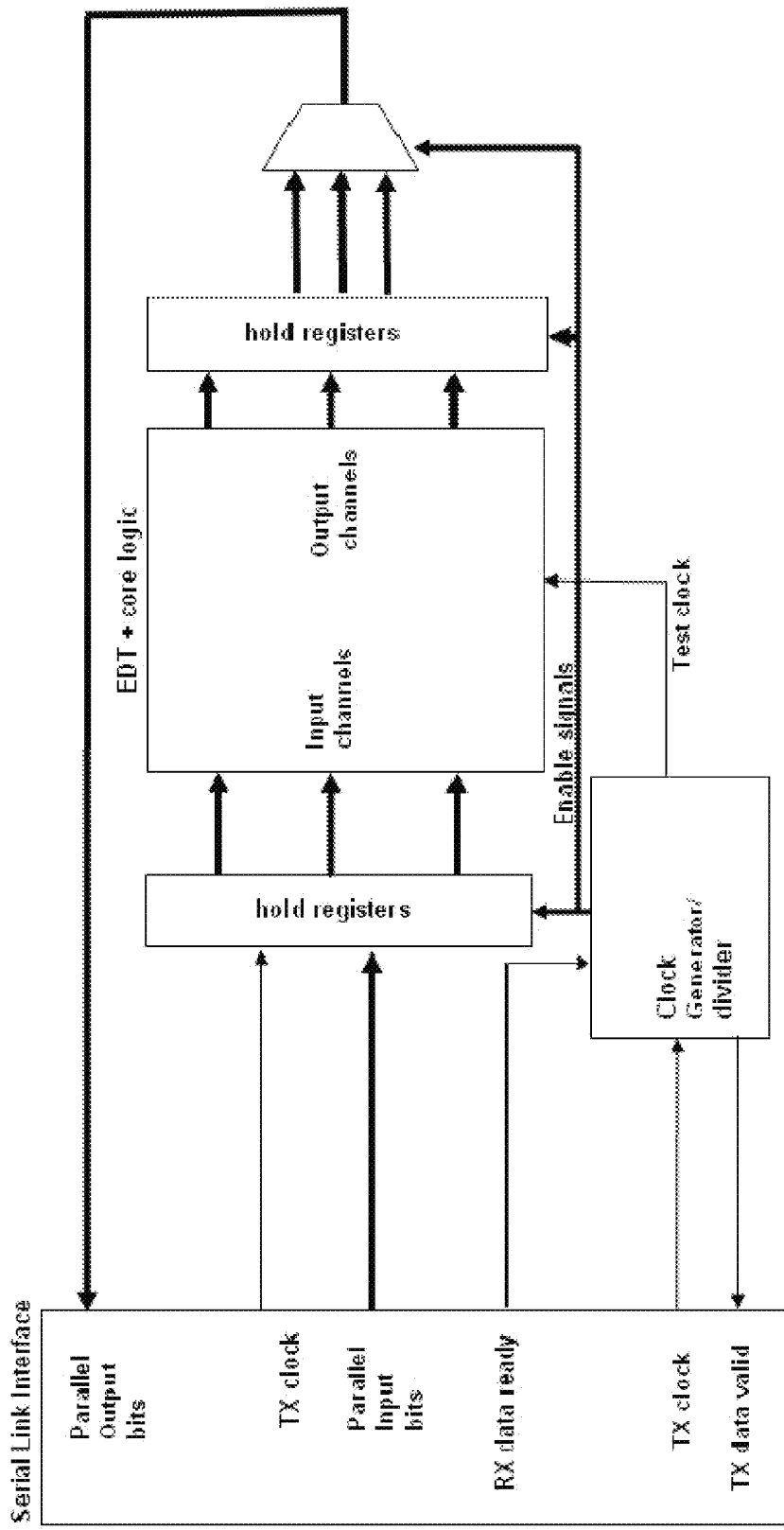
Figure 14: # parallel input bits <= (# EDT channels + #E EDT controls)

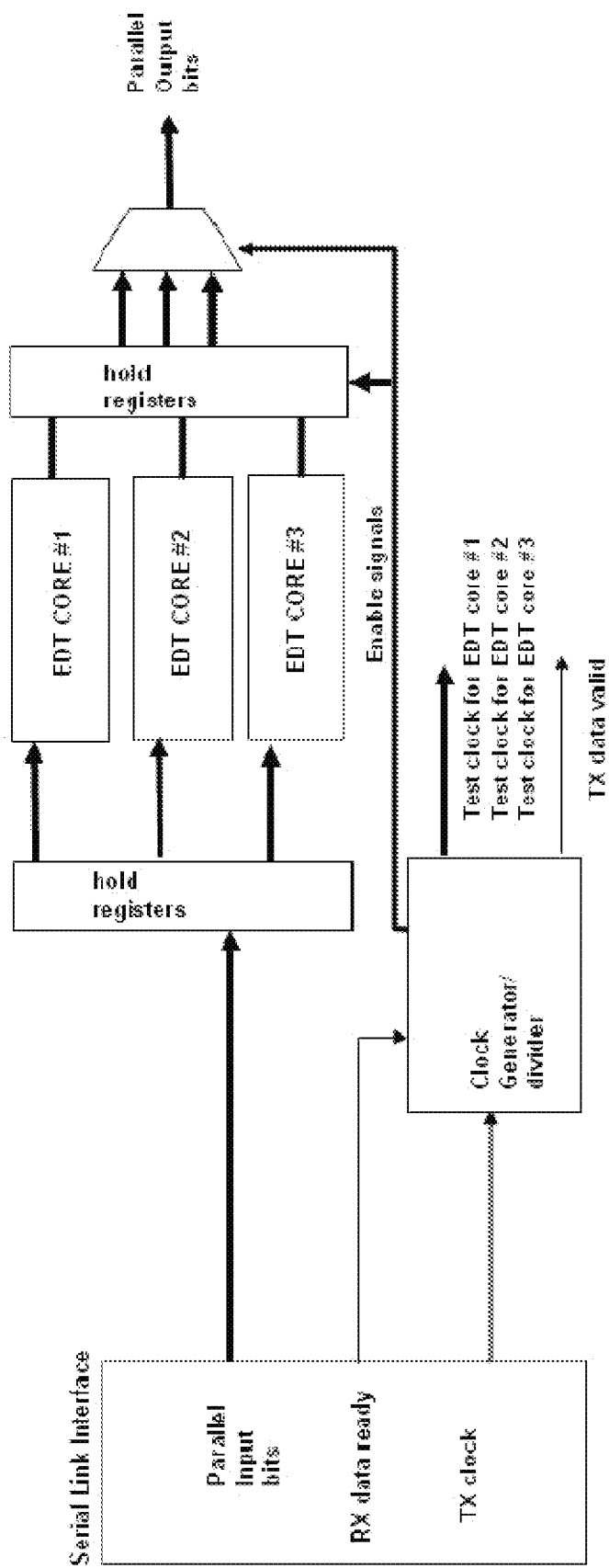
Figure 15: Managing Power Using Independent Test Clocks

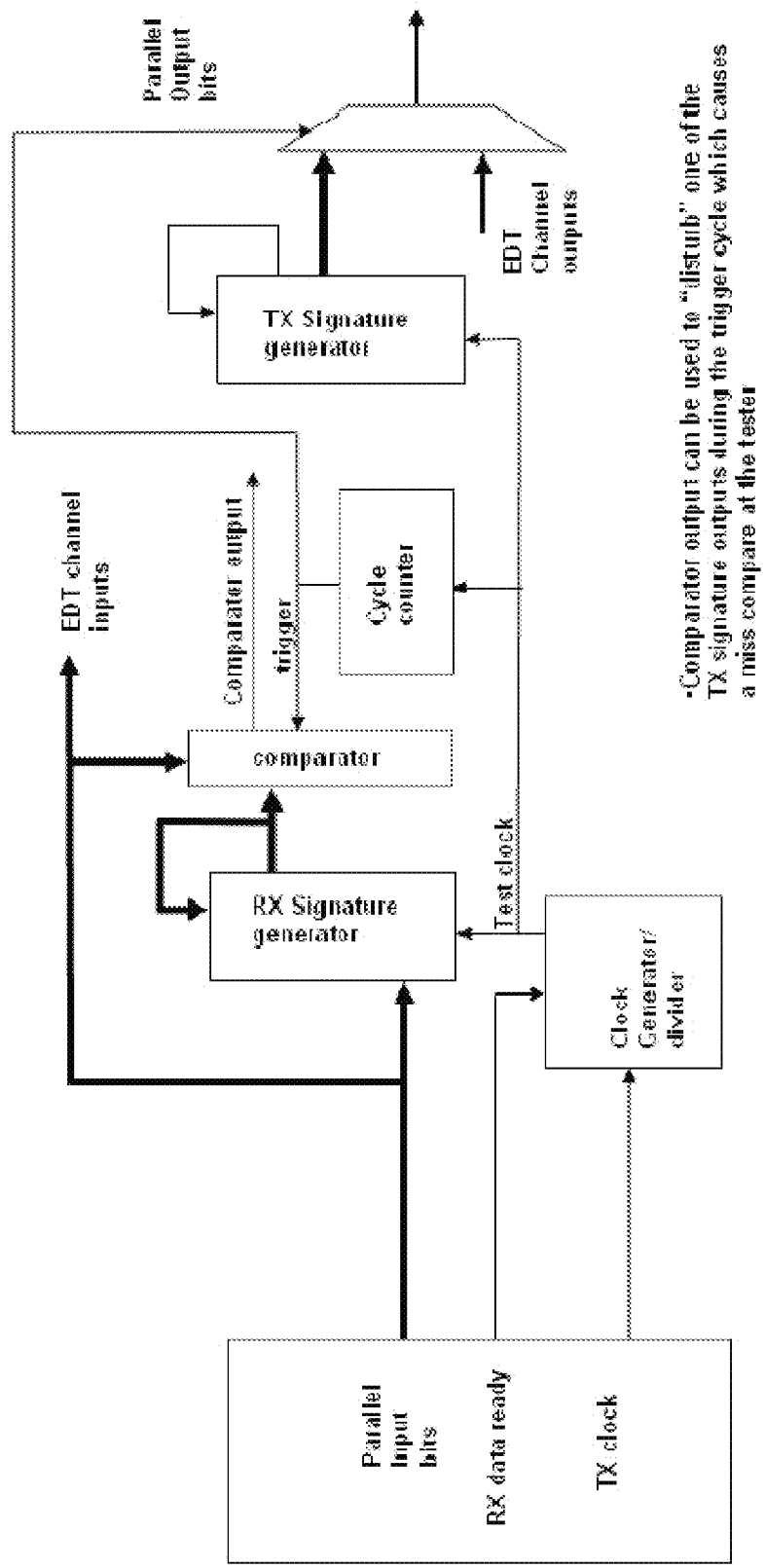
Figure 16: Error Detection Scheme

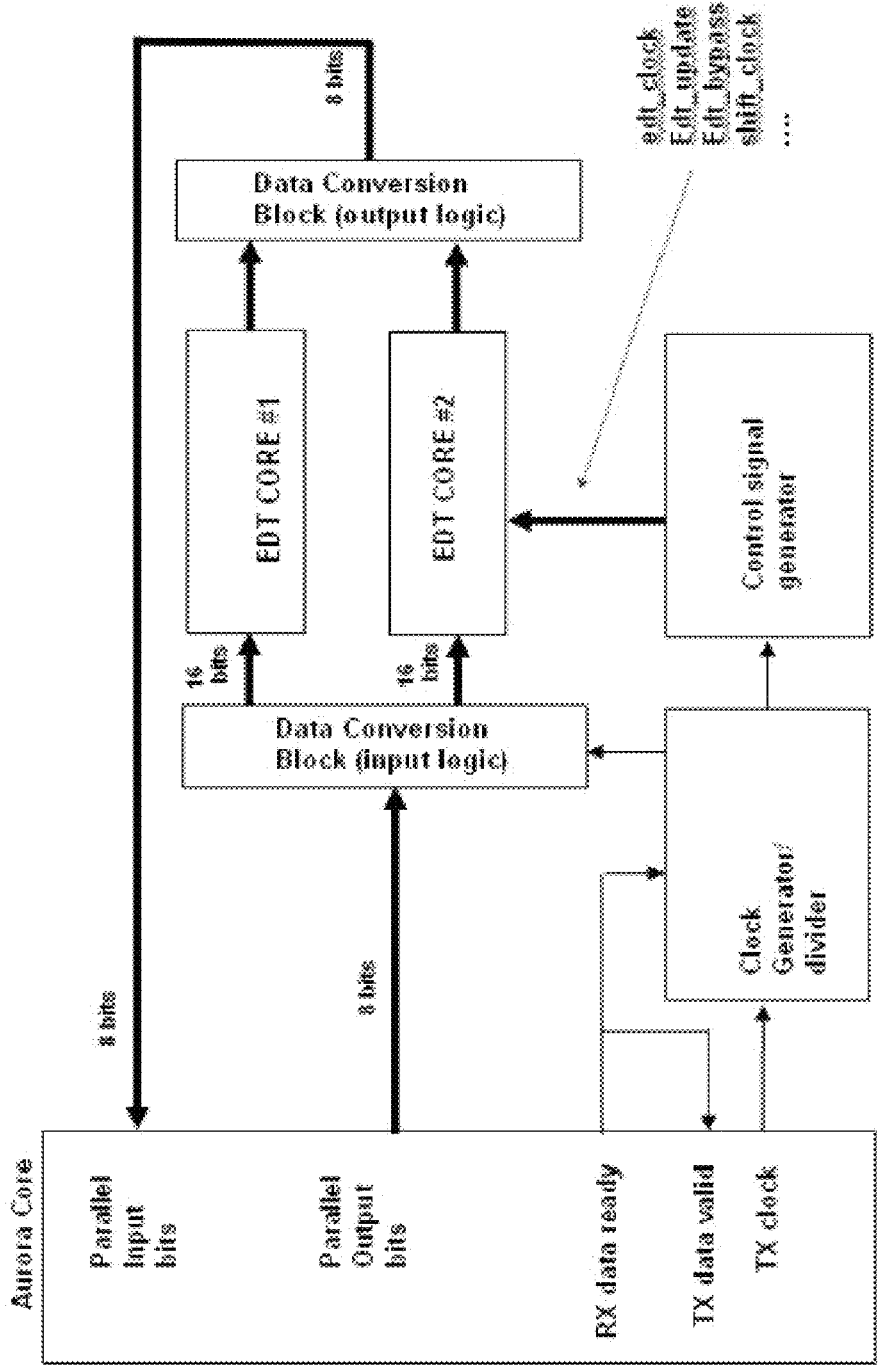
Figure 17: Embodiment of EDT Logic Interfacing with High-Speed I/Os

SCAN TEST APPLICATION THROUGH HIGH-SPEED SERIAL INPUT/OUTPUTS

RELATED APPLICATIONS

This application claims priority to U.S. Provisional Patent Application No. 61/082,139, entitled "Scent Test Application Through High-Speed Serial I/Os," filed on Jul. 18, 2008, and naming Janusz Rajski et al. as inventors, which application is incorporated entirely herein by reference.

FIELD OF THE INVENTION

The present invention is directed to the use of serial input/outputs to perform testing on integrated circuit devices. Various implementations of the invention may have particular applicability for using serial input/outputs, employing data serialization and deserialization, to both deliver test data to an integrated circuit device and receive test results from an integrated circuit device.

BACKGROUND OF THE INVENTION

The electronics industry is currently witnessing a major change on how data is being transferred between different parts of an electronic system. Conventional parallel input/output (typically referred to as "I/O") schemes reach physical limitations when data rates begin to exceed just 1 Gb/s and can no longer provide a reliable, cost-effective means for keeping signals synchronized. After years of success in using parallel I/O data buses, the electronics industry is regularly replacing them with high-speed serial links. This replacement started on the system level, moving on to inter-board communications, and continuing down to chip-to-chip communications. Some current research is even focusing on how to replace parallel buses inside a single chip with such serial point-to-point schemes. This change is driven by companies across a wide-range of industries as a means to reduce system costs, simplify system design, and provide the scalability needed to meet new bandwidth requirements. Serial I/O-based designs offer many advantages over traditional parallel implementations including fewer device pins, reduced board space requirements, fewer printed circuit board (PCB) layers, easier layout of the PCB, smaller connectors, lower electromagnetic interference, and better noise immunity, as discussed in the article "High-Speed Serial I/O Made Simple", by Abhijit Athaval and Carl Christensen, Xilinx, 2005.

Serial links can use parallel circuitry schemes and multiplexing to allow data transfer at very fast rates. (As used herein, the terms "link," "lane" and "channel" will be used interchangeably to refer to a communication path for conveying a stream of data.) In addition, several serial links can be used in parallel to transfer large amounts of data. While each serial link typically will be completely asynchronous with respect to other serial links, digital techniques such as "channel bonding" allow combining these links and making them appear as if data is transmitted over a single channel.

Conventional integrated circuit scan test techniques rely on a large bandwidth between the device-under-test (DUT) and the automatic test equipment (ATE) performing the test. Test data from the automatic test equipment is applied to the device-under-test through scan chains, followed by some capture cycles during which the circuit response is captured in the cells of the scan chains. The circuit response is then unloaded from the circuit through the scan chains. The response is compared in the automatic test equipment to determine if the device-under-test is free of manufacturing defects. Under such circumstances, both the test stimuli and the test responses corresponding to the entire image of the scan chains are stored in the automatic test equipment memory. As bandwidth has become scarcer, the scan chains have become fewer and longer, thereby resulting in a significant increase in the overall test application time.

In current designs, as the pin-to-gate ratio continue to decrease, the number of functional pins that are accessible at the top level is decreasing as well. As high-speed I/Os are becoming prevalent, the number of digital pins that can be reused for manufacturing test is diminishing. It is becoming a luxury to have a few digital pins, if at all, for manufacturing test. On the other hand, as the semiconductor industry moves towards smaller technology nodes, new defect mechanisms are arising, thereby leading to the adoption of new fault models that require even larger numbers of test stimuli patterns targeted to identify them. Together with larger design sizes and new fault models, there is a tremendous growth in the number of test stimuli patterns that need to be applied during manufacturing test. Even if scan volume is not a concern (assuming very large automatic test equipment memory), the amount of test time needed to apply all of the different test stimuli patterns through a few long scan chains is prohibitive in practice. The circuit can be designed the in a way to support a high speed at which test stimuli patterns can be shifted into scan chains, but power dissipation during shift, and automatic test equipment limitations with regard to accuracy and precision, prohibit shifting scan data beyond a certain speed.

To mitigate the rising test cost associated with both increased test data volume (due to explosion in the number of test patterns) and test time discussed above, test compression techniques such as embedded deterministic test (EDT) have been introduced. (See, e.g., "Embedded Deterministic Test", by J. Rajski, J. Tyszer, M. Kassab, and N. Mukherjee, *IEEE Transactions on CAD of Integrated Circuits and Systems*, vol. 23, No. 5, May 2004, pp. 776-792, which article is incorporated entirely herein by reference.) A typical test compression scheme, such as embedded deterministic test, is illustrated in FIG. 1. Instead of storing the entire image of scan chains in the automatic test equipment memory, the test data is compressed and only the compressed stimuli as well as responses are stored in the automatic test equipment memory.

To facilitate such a compression scheme, a decompressor and a compactor are added on-chip. The decompressor take the compressed data at the input side and decompresses it into the data required in the scan chains for targeting specific faults. Similarly, at the output side, the responses are compressed by the compactor in such a way that there is little or no loss in the information pertaining to defect coverage of the device. Scan testing employing compression techniques like embedded deterministic test not only reduces test cost, but also helps in minimizing the volume of data transferred between the device-under-test and the automatic test equipment. The device-under-test can literally have thousands of scan chains internally between the decompressor and the compactor, but only a limited number of channels are exposed to the automatic test equipment.

For design with very few available pins for digital test, a scheme like embedded deterministic test helps as it minimizes the number of pins required for test. It should be noted, however, that even with embedded deterministic test, there is a minimum requirement for a certain number of digital pins (typically three) for the device to be tested. In order to keep the test time under control, one solution is to increase the number of internal scan chains into tens of thousands, but then routing and power constraints dictate the need for multiple decompressor and compactors distributed throughout the chip, instead of a single centrally located decompressor and compactor. Each one of these decompressors needs a channel input and each one of the compactors needs a channel output, thereby increasing the bandwidth needed for transferring data between the automatic test equipment and the device-under-test.

BRIEF SUMMARY OF THE INVENTION

Aspects of the invention relate to the use of high-speed serial I/Os for scan testing of integrated circuit devices. For conventional scan tests, FIG. 1 shows how scan data and test control data can be transferred between the automatic test equipment and the device-under-test using high-speed serial links. Such architecture may not reduce the test data volume, but it can minimize the test application time. According to various implementations of the invention, instead of having a few long scan chains, an integrated circuit device can have numerous shorter scan chains, along with some test access mechanism (TAM). The test access mechanism converts the high speed serial data to parallel chunks of data that can be applied directly to the scan chains at the input side, and, at the output side, scan data from all of the scan chains can be captured into a register and then serialized before transferring it back to the automatic test equipment through the high-speed link. In FIG. 2, a simple test access mechanism that may be employed according to various examples of the invention is shown. This simple test access mechanism includes a serial-to-parallel data convertor at the input side and parallel-to-serial data converter at the output side.

As is evident from the above discussions above, using high-speed serial I/Os to transfer data back-and-forth between the automatic test equipment and the device-under-test helps to address two major issues for designs with or without the test compression hardware. First, the use of high-speed serial I/Os allow the application of scan test to the digital portions of the device-under-test even with no specific digital pins at the device interface. Second, it helps reduce the total test application time by quickly transferring large amounts of data from the automatic test equipment to the device-under-test, which can then be provided to either multiple scan chains or multiple on-chip decompressors.

In addition, the use of high-speed serial I/Os can provide secondary benefits for scan testing. For example, standard high-speed serial I/Os on automatic test equipment can help expedite the adoption of multi-site testing. Assuming that every die with embedded deterministic test compression logic has an interface to handle high-speed serial I/O signal, multiple serialization/deserialization (typically referred to as "SerDes" herein) channels can be used to supply data at a much higher rate to multiple dies at the same time. This can effectively improve the test throughput, thereby minimizing the overall scan test time.

Various examples of the invention discussed below provide a scan test architecture that utilizes high-speed serial I/O protocols, with or without a test compression scheme such as embedded deterministic test (EDT), to effectively improve the overall test throughput for complex System-on-Chip (SOC) designs. Various implementations of the invention may be particularly useful with regard to scan testing schemes employing compression techniques, however. As will be appreciated by those of ordinary skill in the art from the discussion below, test compression techniques employed together with the use of high-speed serial I/Os allow for significant reduction in both test data volume as well as test application time. Accordingly, various examples of the invention will be described herein with reference to scan testing using compression techniques. A typical embedded deterministic test architecture utilizing a high-speed serial I/O link is shown in FIG. 3. It should be appreciated, however, that the use of high-speed serial I/Os for scan testing according to various embodiments of the invention will work with designs that have no test compression hardware as well, and thus is intended to be within the scope of this disclosure and the attached claims.

With various examples of the invention, the interface between the automatic test equipment and the device-under-test is assumed to be capable of carrying data at very high speeds. The channel typically will be a full-duplex channel, and the high speed I/Os typically will be capable of transmitting and receiving data at the same time. According to some implementations of the invention, the protocol and hardware necessary to support such high speed data transfer resides on both the automatic test equipment and the device-under-test. Also, on the device-under-test, the high-speed serial links typically may be used for the functional mode of operation as well.

With various examples of the invention, the data that is transferred from the automatic test equipment to the device-under-test may not only include scan data, but also may include one or more of the control data, clocking information, packet information, error control mechanisms, etc. In various implementations, this data may be intercepted on-chip, descrambled, and then applied to the embedded deterministic test logic. Similarly, at the output side, the data typically will be properly encoded and packetized before it is sent back to the automatic test equipment. The same mechanisms will typically exist at the automatic test equipment side, so that the test responses can be compared with the golden responses stored in automatic test equipment memory.

In various examples of the invention, the data from the automatic test equipment will be transferred at the channel link rate, which can then be accepted by the on-chip hardware, slowed down (buffered) if needed, and then applied to the embedded deterministic test logic. Similarly, at the output side, numerous bytes of output responses typically will be collected, encoded, and then sent back to the automatic test equipment. However, with some examples of the invention if the device-under-test is large and can utilize large blocks of data at a higher rate, then the need for buffering can be reduced.

As seen in FIG. 3, the test stimuli are sent to the device-under-test from the automatic test equipment and the responses are sent to the automatic test equipment from the device-under-test. The high-speed serial links according to various examples of the invention can be used to not only transmit and receive data as is required for conventional scan test, but alternately or additionally can be utilized for any other mode of test data transfer between the automatic test equipment and the device-under-test to structurally test any logic. For example, high-speed serial I/Os cording to various examples of the invention may be used to transmit the expected responses along with the stimuli from the automatic test equipment to the device-under-test, such that the responses are compared on-chip and the output of the comparator is compacted into a signature.

BRIEF DESCRIPTION OF THE DRAWINGS

FIG. 1 illustrates a typical scan test compression scheme.
FIG. 2 illustrates how scan data and test control data can be transferred between automatic test equipment and a device-under-test using high-speed serial links according to various implementations of the invention.

FIG. 3, illustrates a typical embedded deterministic test architecture utilizing a high-speed serial I/O link that may be employed according to various implementations of the invention.

FIG. 4 shows the logical layers that constitute a typical high-speed communication interface that may be employed according to various implementations of the invention.

FIG. 5 shows the use of a high-speed serial link that may be employed according to various implementations of the invention in transferring data between "high-speed" automatic test equipment (ATE) from one side and a device-under-test (DUT) with an on-chip serial interface in addition to embedded deterministic test IP on the other side.

FIG. 6 shows a generic block diagram for a SerDes block that may be employed according to various implementations of the invention.

FIG. 7 illustrates a device-under-test according to various implementations of the invention that employs multiplexers on the transmit side and de-multiplexers on the receive side to divert the parallel data between testing and device operation.

FIG. 8 illustrates an interface for a tester and on-chip test module employing a black-box channel scheme according to various implementations of the invention.

FIG. 9 illustrates a proposed test setup according to various implementations of the invention.

FIG. 10 shows different blocks for embedded deterministic test logic that may be employed according to various implementations of the invention and the signals that are used for its operation.

FIG. 11 indicates the different phases of test during the operation of a scan test application according to various implementations of the invention.

FIG. 12 illustrates a data conversion block that may be employed according to various implementations of the invention.

FIG. 13 illustrates a first scenario for implementing high-speed serial I/Os for a scan test according to various implementations of the invention where the number of parallel bits from the serial link interface is greater than or equal to the embedded deterministic test number of channels.

FIG. 14 illustrates a first scenario for implementing high-speed serial I/Os for a scan test according to various implementations of the invention where the number of parallel bits from the serial link interface is less than the number of embedded deterministic test channels.

FIG. 15 illustrates an arrangement that may be employed according to various implementations of the invention to use multiple TX clock cycles to generate an independent "test_clock" signal for each embedded deterministic test core.

FIG. 16 illustrates the use of a linear feedback shift register (LFSR) that builds a signature from the Parallel Input Bits, and another LFSR that produces a signature using the data that is being sent on the Parallel Output Bits according to various implementations of the invention.

FIG. 17 illustrates an example of an implementation of the invention having two embedded deterministic test modules that use a total of 32 channels (16 channels each), each shifting data at 37.5 Mb/s.

DETAILED DESCRIPTION OF THE INVENTION

General Considerations

Disclosed below are representative embodiments of methods, apparatus, and systems for performing scan testing using high-speed serial link interfaces, such as scan testing between a device-under-test and automatic test equipment, which should not be construed as limiting in any way. Instead, the present disclosure is directed toward all novel and nonobvious features and aspects of the various disclosed methods, apparatus, and systems, alone and in various combinations and subcombinations with one another. Also, the disclosed technology is not limited to any specific aspect or feature, or combination thereof, nor do the disclosed methods, apparatus, and systems require that any one or more specific advantages be present or problems be solved. Any of the methods, apparatus, and systems described herein can be used in conjunction with a wide variety of scan-based or partially-scan-based circuits can be tested using automatic test equipment.

Although the operations of some of the disclosed methods are described in a particular, sequential order for convenient presentation, it should be understood that this manner of description encompasses rearrangement, unless a particular ordering is required by specific language set forth below. For example, operations described sequentially may be rearranged or performed concurrently. Moreover, for the sake of simplicity, the figures may omit various alternate ways in which the disclosed methods, apparatus, and systems can be used in conjunction with other methods, apparatus, and systems, but these alternate ways are intended to be encompassed herein. Additionally, the description sometimes uses terms like "determine," "identify," and "constrain" to describe the disclosed technology. These terms are high-level abstractions of the actual operations that are performed, but the actual operations that correspond to these terms are readily discernible by one of ordinary skill in the art. Also, as used herein, unless the context dictates otherwise, the term "coupled" means electrically or electromagnetically connected or linked and includes both direct connections or direct links and indirect connections or indirect links through one or more intermediate elements not altering the intended operation of the circuit.

The disclosed embodiments can be implemented in a wide variety of environments. For example, various aspects of the disclosed techniques can be implemented by software comprising computer-executable instructions stored on computer-readable media (e.g., one or more CDs, volatile memory components (such as DRAM or SRAM), or nonvolatile memory components (such as hard drives)). Such software may comprise, for example, electronic design automation ("EDA") software (e.g., an automatic test pattern generation ("ATPG") tool) used to generate test patterns for testing one or more circuits (e.g., an application specific integrated circuit ("ASIC"), a programmable logic device ("PLD") such as a field-programmable gate array ("FPGA"), or a system-on-a-chip ("SoC") having digital, analog, or mixed-signal components thereon). Such software may also comprise, for example, EDA software used to diagnose test responses to chain diagnosis test patterns applied to the one or more circuits. These particular software implementations should not be construed as limiting in any way, however, as the principles disclosed herein are generally applicable to other software tools. Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For the same reason, computer hardware is not described in further detail. For example, the disclosed embodiments can be implemented using a wide variety of commercially available computer systems and/or testing systems. Any of the disclosed methods can alternatively be implemented (partially or completely) in hardware (e.g., an ASIC, PLD, or SoC).

Further, test patterns or diagnostic results (including any intermediate or partial test patterns or diagnostic results) produced from any of the disclosed methods can be created, updated, or stored on computer-readable media (e.g., one or more CDs, volatile memory components (such as DRAM or SRAM), or nonvolatile memory components (such as hard drives)) using a variety of different data structures or formats. Such test patterns and/or diagnostic results can be created or updated at a local computer or over a network (e.g., by a server computer).

The one or more integrated circuits being tested may additionally comprise specialized hardware components used to implement the testing (e.g., compression hardware). Such integrated circuits can be used in a vast assortment of electronic devices, ranging from portable electronics (such as cell phones, media players, and the like) to larger scale items (such as computers, control systems, airplanes, automobiles, and the like). All such items comprising integrated circuits tested with embodiments of the disclosed technology or equivalents are considered to be within the scope of this disclosure.

Overall Test Architecture with High-Speed Input/Outputs

Because high-speed serial links were initially designated to be used in the telecommunications industry, their use has inherited many of the definitions and terminologies from the telecommunications industry, one of which is the "layered system architecture." FIG. 4 shows the logical layers that constitute a typical high-speed communication interface: the transaction layer, the data link layer, and the physical layer. Another legacy from the telecommunications industry is the use of packets to transfer data between multiple sides of the link. Each of these logical layers includes one or more components used to handle those packets at the transmit side, and is responsible for dealing with the data on the receive side.

As seen in FIG. 4, the upper layer of the architecture is the transaction layer. Its primary responsibility is the assembly and disassembly of data into and from packets. The data link layer is the middle layer and serves as an intermediate stage between the transaction layer and the physical layer. The primary responsibilities of the data link layer include link management and data integrity, including error detection and error correction. The physical layer includes two main parts: an electrical interface, usually called the SerDes (Serializer/Deserializer), which encompasses all circuitry for the interface operation, including the driver and input buffers, parallel-to-serial and serial-to-parallel convertors, transmitters for a phase-locked loop (PLL), circuitry for receiving data and a clock recovery phase-locked loop and impedance matching circuitry. It also includes logical functions related to interface initialization, maintenance and data packet encoding/decoding or scrambling. There exist many pre-defined standards for serial links that define specifically each of the above layers, so that components from different vendors are interoperable, i.e., they can easily 'talk' to each other.

In typical implementations, these layers are often integrated through two main modules: the controller module and the PHY module. The controller module groups both the transaction and link layers. Often, the designer integrated the System-on-Chip can obtain controllers for different standard serial interfaces in the form of soft intellectual property (IP) such as, for example, a synthesizable Register Transfer Level (RTL) description. As discussed herein, such reusable building blocks, whether soft IP or hard IP (for example, in the form of a GDSII format file), may be referred to collectively simply as IP.

The PHY module includes the physical layer with its two components, the electrical and logical blocks. Because the SerDes block works at a very high frequency, often at the allowable limit of the integrated circuit (IC) fabrication process where physical placement and routing have a major effect on the circuit performance, the designer integrating the System-on-Chip may only be able to obtain this block in a hard IP format, i.e., a process-specific layout. However, the logical block works at a much lower frequency, so it typically is available with the SerDes block as a soft IP, or is hardened with the SerDes block and offered as a complete PHY module.

The PHY module electrical block functionalities are usually the same between most pre-defined or custom made serial links. Possible variants may be distinguished by parameters such as data rate and some vendor specific differentiating capabilities, such as for example, enhanced test capabilities. On the other side, the PHY module logical block, the link layer and the transaction layers are typically standard-specific, i.e., they can only be used for a specific standard or a custom defined protocol.

To utilize such high-speed links in integrated circuit device production testing, both the tester and the device under test implement, in one way or another, all of the above communication layers and IP blocks for a pre-defined communication protocol. For example, FIG. 5 shows the use of a high-speed serial link in transferring data between "a high-speed" automatic test equipment from one side and a device-under-test with an on-chip serial interface in addition to embedded deterministic test IP on the other side. The link is a full-duplex one, as is the case of most high-speed serial links. This allows compressed patterns to be sent to the device-under-test and the output signature to be retrieved in the same time as in standard production testing. In this implementation, both the automatic test equipment and the device-under-test use compatible SerDes blocks operating at the same data rate. At the same time, the upper layers (referring back to FIG. 4) are identical on both sides. An example of a fully defined link protocol will be discussed in more detail below.

Integration of High-Speed Input/Outputs

FIG. 6 shows a generic block diagram for a SerDes block that may be employed according to various implementations of the invention. In particular, the upper part of the SerDes block shows the data transmit path after serialization, while the lower part shows the data receive path and deserialization. As no clock is sent with the data, the clock and data recovery (CDR) block is usually composed of a phase-locked loop (PLL) to retrieve the clock value from the incoming bit stream and filter high-frequency associated jitter. Also, because the output impedance of the output drivers and buffers for various embodiments of the invention should be accurately matched to the channel, an on-chip calibration technique may be used.

In the middle of the FIG. 6 lies the transmit phase-locked loop that supplies both the high speed serial data clock, HSTX CLK, and the low-speed parallel interface clock, TX CLK, to the transmit path. Due to reference clock tolerance, usually in hundreds of parts per million (ppm), the TX CLK and RX CLK are not exactly the same. This is addressed by the link layer block, as will be described below.

In the device-under-test, two additional IP blocks may be added to enable the use of a system that employs high-speed serial I/Os according to various implementations of the invention. The SerDes block may be, e.g., a pure analog hard IP block. Accordingly, there typically will be two models to follow on the device-under-test according to various examples of the invention. First, the System-on-Chip may have either no high-speed serial link, or have a high-speed serial link where the PHY module logical block is hardened so that the parallel data interface after the SerDes block is not available. In these situations, a dedicated SerDes block is placed on the device-under-test.

Alternately, the System-on-Chip may have either a custom or standard-based high-speed serial link where the PHY module logical block is an RTL block or a soft IP block. In these situations, multiplexers (transmit side) and de-multiplexers (receive side) are placed to divert the parallel data as shown in FIG. 7. The test_mode input signal puts the mux/de-mux in the design-for-test (DFT) mode, where data is diverted from the customer PHY module logical block to the DFT-specific PHY module logical and controller block. With various examples of the invention, the DFT-specific PHY module logical and controller blocks can be implemented in a single, pure digital IP. The interface signals between all layers are usually very well documented, while those between the PHY module electrical and logical blocks are typically vendor specific. It should be appreciated, however, that, as the idea of using high-speed serial communication links in scan test applications according to various implementations of the invention becomes widely spread, a differentiator for SerDes blocks and PHY module IP providers would be to have a dedicated interface to ease the use of the corresponding IP for scan testing.

As seen in the figures, the PHY module logical block follows the SerDes block. Its primary function is to detect connectivity and initialize the link. Link initialization is performed to activate the link and align the received data to the proper boundaries through special sequences. It usually takes place upon power-up, reset and connection of two serial links. A PHY READY signal can then be sent to the link layer to indicate that the physical connection is established.

Several data operations may be performed in the link layer according to various implementations of the invention. First, with various implementations of the invention, in order to be able to retrieve clock information, sufficient data transition must be guaranteed in the transmitted packets. This is accomplished by using an encoding or scrambling scheme, as well as by inserting pre-defined idle sequences whenever there is no data to transmit. Special sequences can be used to define packet boundaries and to differentiate between data and control information for the serial link. Also, in order to compensate for clock tolerance, another special sequence may be repeated whenever possible in the transmit data, so that it can be either dropped or repeated at the receive side. The Parallel Data OUT and the RX CLK signals may then be routed through an elastic buffer in order to re-synchronize the received data with respect to the less jittery TX CLK.

Still further, link error detection and correction may be employed in the link layer, as error handling is an important feature of any serial link. There are at least two types of errors that might occur during link communication according to various implementations of the invention: hard and soft errors. A hard error occurs when (i) there is an overflow/underflow in either of the elastic buffers, (ii) there are too many soft errors, (iii) the other side undergoes a reset, indicated by receipt of initialization sequences, or (iv) the physical connection is broken. Hard errors are considered catastrophic errors, after which the channel should immediately be re-initialized. Any data unit being received when a hard error occurs is corrupt and should be discarded. Soft errors are typically due to transient bit errors on the lane, and do not necessarily require the channel to be reset. A method for soft error handling will be discussed in more detail below.

According to various examples of the invention, the transaction layer may receive data from and send data to the application, organize the data in frames, and pass it to the link layer to add link-management sequences. The use of dedicated special sequences on the serial link to transmit other information than the useful data, as well as the use of encoding schemes in most of the links, leads to link data overhead. Given the desired application data transfer rate, called the "payload", there are two schemes to determine the actual channel data rate and packet handling that typically implementations of the invention may be employed according to some implementations of the invention: a black-box channel scheme and a controlled packet scheme.

With the black-box channel scheme, the channel data rate is chosen to be higher than the desired payload to compensate for the overhead. This is the most general solution, because the link is somewhat treated as a black box. Packet composition is left to the link to determine. The size of the data frame should be chosen a-priori, so that enough start-of-frame (sf) symbols to align to, end-of-frame (ef) symbols, and idle symbols to provide for clock correction are guaranteed. The bigger the data frame, the less overhead and the more bandwidth available for data. The smaller the data frame, the more alignment and clock correction characters. A FIFO buffer at both ends of the link translates from data rate to channel rate and vice-versa.

With the black-box channel scheme, the interface for the tester and on-chip test module is a simple one as shown in FIG. 8. It is composed of the following signals.

Parallel RX data bus: Output—The parallel data bus received from the link after removing all link overhead symbols.

RX data valid: Output—Indicates that the parallel RX data bus signals are valid ones.

Parallel TX data bus: Input—The parallel data bus to be sent through the link.

TX data valid: Input—Indicates that the parallel TX data bus signals are valid ones.

TX data ready: Output—Indicates that the link is ready to send data.

TX CLK: Output—The clock generated by the transmit PLL in the SerDes. Both the RX and TX data bus are synchronized with respect to this clock.

With the controlled packet scheme, in most cases the same reference clock is supplied to both the automatic test equipment and the device-under-test, so no clock correction typically is needed. Also, the need for special sequences can be limited to defining the start and end of packets in addition to alignment and idle sequences between packets. In this arrangement, the packet can be defined to contain only the desired bulk of data for a given test with no special sequences within the packet. The overhead can thus be limited to that of the encoding/scrambling schemes. This is a more direct solution, as will be discussed in more detail below.

The interface for the tester and on-chip test module employing a controlled packet scheme is similar to the previous scheme as shown in FIG. 8, with the addition of the following signals:

RX SOF and RX EOF: Output—Indicates the received start and end of frame.

TX SOF and TX EOF: Input—Indicates the send data start and end of frame.

Most serial interfaces employ two kinds of loopback for test purposes: serial loopback and parallel loopback. With serial loopback, the serial driver output is connected in a test mode directly to the serial buffer input. In this arrangement, an on-chip pseudo-random bit sequence (PRBS) generator and checker is implanted on-chip to send data from the transmit path and receive it at the receive path. A pass/fail signal is then generated on-chip. This test is mainly used to check jitter at the output of the serial driver. With parallel loopback, the received parallel data at the end of the PHY module is retransmitted through the transmit data path. In this arrangement, an external bit-error-rate tester (BERT) connected to the receive buffer generates predefined patterns with different jitter stress levels at the link speed. The transmitter output is connected to the BERT checker that verifies the received pattern against the sent one.

Link testing using parallel loopback may be better adapted to a scan test application for verify the device-under-test link interface before the start of the test than link testing using serial loopback. With this arrangement, the automatic test equipment should include special pattern generation and checking, which can be a limited subset from that of the BERT patterns. A proposed test setup is shown in FIG. 9. The automatic test equipment controls the test by sending special commands to the link layer of the device-under-test to put the hardware in a loopback test mode using an internal multiplexer. Another command is sent to free the loopback connection.

Driving Embedded Deterministic Test Logic Via On-Chip Generated Signals

A typical scan test session according to various implementations of the invention requires a few signals to control the overall operation. These signals can be classified into two broad categories: static signals and dynamic signals. Static signals are those that are set during the test setup phase but remain constant during the entire operation of the test application. On the other hand, dynamic signals are the signals that need to be altered during the operation of the test application. Commonly used signals such as clocks, sets, and resets fall into this category.

One of the most important dynamic signals that control the scan operation, especially for mux-D scan architecture, is the scan-enable signal, which helps the circuit switch between two phases of scan operation. The two phases are: a) a load/unload phase, where a new test vector is shifted into the scan chains and the test response for the previous test pattern is shifted out, and b) a capture phase, where the circuit operates in its functional mode thereby allowing the scan cells to capture the responses corresponding to the new test stimuli that was shifted through the scan chains during the load/unload phase. In addition to the normal scan operation, a few additional signals may be used according to various implementations of the invention to assure correct operation of the embedded deterministic test logic. FIG. 10 shows different blocks for the EDT logic and the signals that are used for its operation. Specifically, the signals can be described as follows:

edt_clock—a clock signal that is used to clock the EDT logic.

edt_reset—a reset signal that is used to reset the EDT logic prior to scan test.

edt_update—a signal that is used to reset the decompressor at the beginning of every pattern as well as latch the masks that are shifted with scan data. These masks are used when unloading the responses from the scan chains.

edt_config—a signal to choose a particular compression configuration.

With various examples of the invention, these embedded deterministic test signals, along with the clocks, can be generated on-chip during a test session. This has two distinct advantages. First, on-chip generation of control signals along with clocks makes the paradigm of "low pin count testing" feasible. An integrated circuit device can then have simply 3 pins—reference clock, edt_channel_in (feeding data into the decompressor), and edt_channel_out (sending back compressed data to the ATE) to run the entire test session. Second, the design style is very conducive for secured devices, as it becomes difficult to reverse engineer the design for the device-under-test based on just the test patterns.

Considering the static signals such as edt_bypass and edt_config, separate single-bit registers can be allocated to latch these values and hold them during the entire test session. Typically, this happens during the test setup phase by executing a test setup procedure. The relationship between some of the dynamic signals controlling the test session is highlighted in the following timing diagram.

FIG. 11 indicates the different phases of test during the operation of a scan test application according to various implementations of the invention. Typically, on-chip generation of embedded deterministic test and scan signals employs a finite state machine (FSM) with numerous states, such as shift, load_unload, capture, idle, etc. The finite state machine can stay in a particular state depending on the parameters specified by the user. Additionally, some of the aforementioned states can be further broken up to indicate, for example, different events within the capture or shift cycles. At various states of the finite state machine, the control signals can be generated appropriately based on the testing specifications or testing requirements. Since the behavior of the finite state machine is quite generic in nature, a detailed description of a finite state machine is omitted herein. Instead, a description of the various control signals and how they are generated during test will be discussed in detail.

As previously noted, the static signals are signals that do not change during the entire test session. Along with the static test signals, to support a low pin count test paradigm the device-under-test also has to know when to start the test session and configure the circuit to start accepting scan test patterns. This can be accomplished in several ways according to various implementations of the invention:

Use of a signal or a set of signals that can be directly controlled from the ATE.

Use of a sequence detector on-chip to detect a particular sequence in the data stream that would configure the device into test mode. The particular sequence may be a pre-determined sequence.

On power-up the device can wait for certain fixed number of cycles to detect the sequence in the data stream. If the pre-defined sequence is detected, the test mode signal is asserted and it remains in that state until the device is switched off again.

If there are bidirectional pins available in the device-under-test, then a particular pin can be used as input during the functional mode of operation, and within a certain number of cycles if a pre-defined sequence is detected, then the circuit is configured into test mode. Once a circuit is configured into test mode, the input bidirectional pin gets configured as an output pin, thereby preventing any more data from coming into the sequence detector during the test session. Once again, the device-under-test typically will have to be switched off to get out of the test mode.

Of course, other methods to monitor the number of patterns applied or keeping a count of the total number of test cycles being executed can be also used to decide when the device-under-test can exit the test mode of operation.

Once the device-under-test is placed in the test mode, a configuration sequence can be scanned into the device as part of the setup before beginning actual application of the test stimuli patterns. Certain register bits can be assigned to signals such as edt_bypass, edt_config, etc., so that the device knows whether the test stimuli patterns are compressed or not, and if compressed, what is the corresponding compression configuration.

Before the beginning of the test session, the device-under-test usually is reset along with the embedded deterministic test logic that is added for test purposes. The edt_reset signal can be shared with the system reset signal. This signal can either come from a dedicated input pin or a Power-on-Reset (POR) signal can be used for resetting the core at the beginning of test. The POR signal may be generated on-chip for functional operation as well.

A brief description of how each one of the dynamic signals can be generated on-chip according to various implementations of the invention will now be discussed in more detail. In particular, for mux-D type scan architectures, the scan enable signal (also referred to herein as "scan_en" signal for brevity) distinguishes between the shift and capture modes of operation during the scan test operation. For other scan architectures, such as Level Sensitive Scan Design (LSSD), a signal is used for the clock controller to distinguish between "shift" and "capture" modes of operation. Therefore, ignoring the specific terms to describe such a signal, for any type of scan architecture, there are two distinguishable modes of scan operation, shift mode and capture mode.

As indicated in FIG. 11, the scan_en signal is asserted during the shift cycles, and is de-asserted during the capture cycles. This can be accomplished by having a shift counter on-chip that can count the exact number of shift cycles needed corresponding to the length of the longest scan chain. The counter interacts with the finite state machine to indicate how long it needs to stay in the shift state, and once a pattern is shifted in, the scan_en signal can be de-asserted to indicate the circuit is in capture mode. With various implementations of the invention, the shift counter can be designed to be a programmable counter, which can be initialized at the beginning of a test. This allows supporting multiple scan chain configurations of different lengths; such as, for example, longer bypass chains in addition to short embedded deterministic test chains.

The scan_en signal also can be used to control the number of capture cycles. The number of capture cycles either can be fixed for all test stimuli patterns or can be designed to be programmable on a per test stimuli pattern basis. For a programmable number of capture cycles, a set of registers can be allocated in the device-under-test to behave as control registers and be part of scan chains. A down counter can be loaded with the value in these registers (part of the test stimuli pattern data) thereby making sure that the finite state machine stays in the capture state for specified number of test cycles. The scan_en signal remains de-asserted during the entire phase.

When the scan_en signal is controlled directly from the automatic test equipment, the scan_en signal can be toggled during the capture cycles to enable detection of certain faults. To allow toggling of the scan_en signal during capture cycles, once again, a specified number of registers in the circuit can be assigned for this purpose and stitched with existing scan chains. These registers are subsequently programmed as part of the test stimuli patterns depending on how the scan_en signal is toggled during the capture state.

The edt_update signal is used for resetting the embedded deterministic test logic and updating the mask registers with the scan chain masking data for scan chains unloading. FIG. 11 shows that the edt_update signal is asserted only during the load_unload phase just after the capture cycles. Since the finite state machine has a state corresponding to the load_unload phase, the edt_update signal can be generated during that phase.

During a scan operation (i.e., the load/unload phase), there are primarily three types of clocks needed: the shift clock, the embedded deterministic test clock, and the capture clocks. The shift clock is used to load and unload the scan data into/from scan chains. The capture clocks are usually the functional clocks that are needed to mimic the functional operation of the circuit. Typically, integrated circuit designs employ one or more phase-locked loops to generate the functional clocks. These phase-locked loops are used to generate the capture pulses during the capture operation as well. For designs that do not have phase-locked loops, the capture clocks can be derived from the shift clock. The embedded deterministic test clock is used to drive the embedded deterministic test logic during the scan test operation. The relationships between the shift, capture, and embedded deterministic test clocks are illustrated in FIG. 11.

The input clock to the device-under-test can be used to derive the shift and embedded deterministic test clocks. The shift clock is pulsed during the entire shift period except during the load_unload phase, whereas the embedded deterministic test clock is pulsed at all times except during the capture phase. Multiple clock enable signals are generated from the finite state machine to gate-off the embedded deterministic test clock during the capture phase and the shift clock during the load_unload phase.

If a design has a phase-locked loop for generating the capture clocks, a hand-shaking mechanism can be implemented between the finite state machine and the on-chip phase-locked loop controller according to various implementations of the invention. Essentially, the finite state machine generates a signal to indicate end of the load_unload phase (or the beginning of the capture phase). This will ensure that, by the time the circuit is in the capture state, the required capture cycles can be fired by the phase-locked loop right away. As mentioned above, the number of capture cycles can be programmed on a per test stimuli pattern basis by using some dedicated register bits in the core. These registers provide an indication to the controller regarding the end of the capture phase and start of the load_unload phase. Additionally, the phase-locked loops can be also controlled for individual test stimuli patterns to indicate the sequence of clock pulses needed to generate at-speed tests. These registers that are used for programming the phase-locked loop may be implemented as part of the scan chains and thus can be loaded appropriately when scanning in the test vector (i.e., the test stimuli).

Generic Serial Interface for Interfacing with EDT Logic

With various implementations of the invention, the serial link interface block may provide incoming data on a parallel data bus that may have 8 or 16 bits for each serial channel. The incoming data is provided relative to a reference clock (i.e., the TX clock) that operates at either $1/8^{th}$ or $1/16^{th}$ of the SerDes block physical data rate. The outgoing data is written out on a parallel bus using the same clock (TX clock).

The two parallel data buses that are connected to the serial link interface block are connected to the embedded deterministic test channel input and output signals, and can be also used to carry embedded deterministic test control signals with various examples of the invention. The embedded deterministic test channel signals may be driven at the target shift rate for the design (which may be significantly slower than the reference clocks from the SerDes block). The data conversion block (DCB) addresses three issues:

The reference clock from the SerDes block link may be much faster than the target shift rate.

The number of bits in the parallel data bus may not match the number of embedded deterministic test channels.

The outputs from the serial link interface block will be invalid during the link initialization cycles, when sending a header/trailer packet, and when sending clock correction codes. The serial link interface provides an RX_data_ready signal that determines the validity of the data.

A traditional scan test operates in a completely synchronous fashion. Each shift cycle consists of three operations (capture scan_out value into tester memory, set the scan_in pin based on the value for the current cycle in tester memory, and pulse the shift clock). In contrast, the SerDes based system transfers data through two completely independent (asynchronously clocked) serial links. Each serial link transfers packet header and trailer information, as well as clock correction data which may interfere with normal data transfer. The "TX data ready" signal that is shown in FIG. 12 determines TX clock cycles when the serial link interface is ready to accept data. This signal is not shown on subsequent diagrams. According to various implementations of the invention, multiple methods can be employed for dealing with TX clock cycles with incoming data (RX data ready is active) where the outbound channel is not ready to transmit.

The most straightforward approach is to maintain complete synchronization between the two channels. Every TX clock cycle that receives data also transmits data. In this approach, the packet boundaries for the two channels remain perfectly aligned and it is sufficient that TX data ready is always high at the same time as RX data ready. Another approach is to add a FIFO at the input. Data is loaded into the FIFO when RX data ready is high, but data is only unloaded from the FIFO when TX data ready is high. In various embodiments, the FIFO capacity is large enough to compensate for the unusable TX clock cycles that occur when the TX channel is transmitting non payload data.

FIG. 13 illustrates a first scenario for implementing high-speed serial I/Os for a scan test according to various implementations of the invention where the number of parallel bits from the serial link interface is greater than or equal to the embedded deterministic test number of channels. In this example, the signals can be directly connected to the embedded deterministic test channels. With this arrangement, the test clock then can be generated from the output reference clock. Also, the test clock does not pulse when the link is not receiving any data (RX data ready signal is not active). The frequency of the test clock can be lowered by using the reference clock as the input to a clock divider and generating the shift clock internally. This approach implies that some incoming data from the serial interface is simply ignored. For example, every other frame of data on the incoming link is ignored when the test clock is obtained by dividing the reference clock by 2.

FIG. 14 illustrates a first scenario for implementing high-speed serial I/Os for a scan test according to various implementations of the invention where the number of parallel bits from the serial link interface is less than the number of embedded deterministic test channels. With this example, the parallel data from a single cycle of the reference clock is not sufficient to drive all of the embedded deterministic test input channels. The embedded deterministic test channel inputs instead can be driven by capturing the data from several cycles of the reference clock into a holding register, and then driving the embedded deterministic test inputs from that register. In this example, the embedded deterministic test output channels are connected to the serial link interface using multiplexing logic that is controlled appropriately to spread the channel output data across several frames. In this approach, hold registers are added at the embedded deterministic test channel inputs. These hold registers are driven by the TX clock, and capture data from several frames in order to drive all the channel inputs. Hold registers are added at the channel outputs as well. These hold registers are driven by the test_clock signal, and are used to hold the channel output value so it can be unloaded using several cycles of TX clock. The tester, that is the automatic test equipment, and the device-under-test, will each have a SerDes physical level block (analog) and a serial link interface block that is responsible for link initialization, packet management and low-level error detection.

A traditional tester interface uses a template to describe the shape of the output waveforms for a single cycle, and then generates the waveforms one cycle at a time using the tester memory to define the actual waveforms. The template also determines the appropriate time for strobing primary input pins and the data that is transferred into the tester memory for each test cycle. According to various implementations of the invention, several modifications can be made to properly connect the tester to the serial link interface block. With some implementations of the invention, for example, a modified tester monitors the TX_data_ready signal and transfers data from the tester memory to the parallel output bits (on the serial link interface block) only when the TX_data_ready signal is enabled, and this transfer is done using the TX clock. The tester also monitors the RX_data_ready signal and transfers data from the parallel input bits on the SerDes block into the tester memory also using TX clock.

It should be noted that the SerDes link may be capable of transferring more data than required (constrained by the number of channels or the maximum shift clock frequency). The tester may have to retransmit the same data for several cycles, or send IDLE data across the link. With some implementations of the invention, the interface that transfers data from the parallel output bits to the tester memory will be designed to operate at the maximum possible rate (RX data ready remains high and every TX clock cycle contains fresh data).

As previously noted, a traditional scan test operates in a completely synchronous fashion, where each shift cycle consists of three operations (capture scan_out value into tester memory, set the scan_in pin based on the value for the current cycle in tester memory, and pulse the shift clock). In contrast, a SerDes based system according to various implementations of the invention may transfer data through two completely independent (asynchronously clocked) serial links. Each serial link transfers packet header and trailer information, as well as clock correction data which may interfere with normal data transfer. The serial link interface may compensate for this asynchronous behavior by using an appropriately sized elasticity buffer. The impact of packet header/trailer transmission can be minimized by attempting to keep the two channels (TX and RX) synchronized by operating them symmetrically (i.e., by always sending and receiving exactly the same number of bytes).

Shifting all of the scan cells in a large design may require more instantaneous power than the power grid can provide (assuming the power grid is designed to handle peak power requirements during the functional mode, and not the test mode). This problem can be minimized when working with circuits that are implemented using several blocks that are designed to operate independently (e.g., separate embedded deterministic test hardware for each block, and independent control of the shift clocks). The basic approach is to use multiple TX clock cycles to generate an independent "test_clock" signal for each embedded deterministic test core. For example, if the TX clock is operating at 150 MHz, and the target shift rate is 50 MHz, each test_clock cycle is actually constructed from three TX clock cycles. Instead of generating a single TX clock signal, the TX clock can be pulsed for the first embedded deterministic test core on the first frame, the test clock can be pulsed for the second embedded deterministic test core on the second frame, and the test clock pulsed for the third embedded deterministic test core on the third frame. An implementation of this technique is shown in FIG. 15, but it should be noted that this will result in an asymmetrical test clock waveform (the pulse width matches the 150 MHz clock) which may cause problems during timing closure. A more complex implementation would include holding registers at the embedded deterministic test channel inputs, and stretching the generated clock waveform so the pulse width more closely matches the 50 MHz target.

The SerDes link according to various implementations of the invention is designed to operate with a very low bit error rate when operating in functional mode. However, the error rate may be an issue when operating on a test fixture. Some applications may require the addition of hardware that detects these transmission errors. One simple approach is to add a reasonably sized linear feedback shift register (LFSR) that builds a signature from the Parallel Input Bits, and another LFSR that produces a signature using the data that is being sent on the Parallel Output Bits, as shown in FIG. 16. The tester would be responsible for computing the appropriate signature (either via software, or via hardware on the load board), and sending out the expected signature at pre-determined intervals such as at the end of pattern. The hardware on the chip (in the data conversion block) would compare the expected signature sent from the tester with the internally computed signature and transmit failure information back to the tester. The on-chip hardware would also transmit the signature that is based on data at the parallel output bits to the tester at periodic intervals. The tester would generate a similar signature and compare this value with the one that was transmitted from the device-under-test.

The transmission of scan data (channel or chain inputs and outputs) from the tester to the device-under-test has been discussed in detail above. This discussion, however, assumed that control signals, such as the scan_enable signal and the edt_update signal are generated on-chip without any input from the tester. This means that the actual value of the signal for any given cycle is determined by counting the number of test_clock pulses following the reset of the device. A more flexible approach that may be alternately or additionally employed according to various implementations of the invention is to send both scan data and/or control data from the tester. For example, the automatic test equipment could send control data at the beginning of the test that switches between chain test patterns (scan enable remains high during the capture window), and normal scan test patterns with dynamic scan enable switching. This implies multiplexing of two types of data onto a single transmission bus. This can be done using fixed size packets with control bytes followed by data bytes, or variable size packets, where the control data determines the total size of each packet. A specific multiplexing method can be selected based on the time dependant relationships between the control data and the scan data.

An Illustrative Example

In general, any of the available standard interfaces for serial link communications can be used to represent the physical and data link layer definitions. As for the transaction layer, since it is application specific, it must be defined for the scan test application.

One option is to use the "Aurora Protocol" from Xilinx (see "Aurora Protocol Specification", SP002 (v2.0) Sep. 12, 2007, which is incorporated entirely herein by reference). Aurora is a scalable, lightweight, link-layer protocol that can be used to move data point-to-point across one or more high-speed serial lanes. Aurora is protocol independent, and can be used to transport industry standard protocols, such as Ethernet and TCP/IP, or proprietary protocols. The Aurora Protocol is an open standard and is available for implementation by anyone without restriction.

FIG. 17 illustrates an example of an implementation of the invention having two embedded deterministic test modules that use a total of 32 channels (16 channels each), each shifting data at 37.5 Mb/s. In order to use a high-speed serial link, a single SerDes channel can be used with a total of 8 parallel data bits changing at 150 Mb/s to be transmitted through the serial link. Four frames from the 150 MHz clock can be used to transfer the data from 32 EDT channels operating at 37.5 MHz. The data payload in this case is 8 bits ×150 Mb/s=1.2 Gb/s. The Aurora protocol uses 8b/10b as the line-encoding scheme. In this specific embodiment, it is also assumed that both the device-under-test and the automatic test equipment are using the same reference clock. In this case, the clock frequency would be exactly the same on both link sides and there would be no need for clock correction. The controlled packet scheme, as discussed above, is applied. The channel rate is chosen high enough to accommodate only for the overhead of encoding, and the packet composition is chosen to contain the required test data with no special sequences in between. After encoding, data rate will be 10 bits ×150 Mb/s=1.5 Gb/s, which is the same as the channel rate. The TX CLK as well as the RX CLK will be at 150 MHz, while the HSTX CLK and HSRX CLK will be at 1.5 GHz.

Conclusion

In this disclosure, a methods and devices that utilize high-speed serial links for test data transfer between an automatic test equipment and a device-under-test has been disclosed. The disclosed methods and devices help in eliminating the need for many digital pins for scan test applications, and also may drastically improve the scan test application time as well. As newer protocols for high-speed serial links are being proposed or later generations of existing protocols are being suggested, test delivery can be made very efficient thereby improving the overall throughout of the test floor.

The various implementations disclosed embody a fundamental shift with regard to how automatic test equipment and devices-under-test interact and exchange information. There have been some recent proposals for automatic test equipment to become protocol-aware. (See, for example, A. C. Evans, "The new ATE: Protocol Aware", *In Proceedings of ITC*, pp. 1-10, 2007, which article is incorporated entirely herein by reference.) If automatic test equipment adopts high-speed data transfer protocols primarily for functional testing of devices, the methods and devices disclosed herein can expedite adoption of such links for scan test as well.

In view of the many possible embodiments to which the principles of the disclosed technologies may be applied, it should be recognized that the illustrated embodiments are only preferred examples of the disclosed technologies and should not be taken as limiting the scope of the invention. Also, while the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

What is claimed is:

1. A method of using high-speed serial links for scan testing for manufacturing defects, comprising:
    receiving a bit stream through a first unidirectional channel of a first high-speed serial interface of a DUT (device under test), wherein the bit stream comprises data related to scan testing and a first high-speed clock value associated with the first high-speed serial interface; and
    sending data related to test responses through a second unidirectional channel of the first high-speed serial interface of the DUT.

2. The method recited in claim 1, wherein the data related to scan testing include scan data.

3. The method recited in claim 2, wherein the data related to scan testing further include control data.

4. The method recited in claim 3, wherein the control data are used to generate one or more control signals including a scan enable signal.

5. The method recited in claim 1, wherein the data related to scan testing include compressed scan data.

6. The method recited in claim 1, wherein the data related to scan testing include expected test responses.

7. The method recited in claim 1, wherein the first high-speed serial interface includes a SerDes (Serializer/Deserializer) block that is not dedicated for scan testing, a PHY-logical and controller block for scan testing, and a multiplexing and de-multiplexing module between the SerDes block and the PHY-logical and controller block.

8. The method recited in claim 1, wherein the first high-speed serial interface is dedicated for scan testing.

9. The method recited in claim 1, wherein the first high-speed serial interface receives and sends data using the Aurora 8B/10B Protocol.

10. The method recited in claim 1, wherein the DUT includes one or more signature generators for detecting transmission errors.

11. The method recited in claim 10, wherein the one or more signature generators are one or more linear feedback shift registers.

12. The method recited in claim 1, wherein the first high-speed serial interface includes a buffer for compensating for asynchronous behavior.

13. The method recited in claim 1, wherein the first unidirectional channel of the first high-speed serial interface comprises a high-speed differential signal.

14. The method recited in claim 1, wherein the DUT has a data conversion block.

15. The method recited in claim 14, wherein the data conversion block includes a FIFO (first in, first out) buffer for compensating for asynchronous behavior.

16. The method recited in claim 15, wherein the FIFO (first in, first out) buffer is also used to compensate for unusable cycles of a TX clock when the TX clock is faster than a shift clock.

17. The method recited in claim 14, wherein the data conversion block includes hold registers connecting parallel bits of the first high-speed serial interface with channels of the DUT.

18. The method recited in claim 1, wherein the DUT includes a clock generator/divider.

19. The method recited in claim 18, wherein the clock generator/divider includes one or more PLLs (phase-locked loops).

20. The method recited in claim 1, wherein the DUT has a control signal generator.

21. The method recited in claim 20, wherein the control signal generator includes an FSM (finite state machine) system for generating one or more dynamic control signals including a scan enable signal.

22. The method recited in claim 20, wherein the control signal generator includes one or more registers storing one or more static control signals.

23. The method recited in claim 22, wherein the one or more static control signals are determined from a configuration sequence in the data related to scan testing.

24. A circuit for using high-speed serial links for scan testing for manufacturing defects, comprising:
    a high-speed serial interface configured to send scan data to and receive test responses from one or more test cores, wherein the high-speed serial interface comprises a unidirectional transmit channel associated with a high-speed transmit clock output by a clock circuit within the circuit and a unidirectional receive channel associated with a high-speed receive clock derived from a bit stream on the unidirectional receive channel;
    a clock generator/divider configured to generate clock signals for the one or more test cores based on signals from the high-speed serial interface; and
    a control signal generator configured to generate control signals for the one or more test cores.

25. The circuit recited in claim 24, further comprising one or more data conversion blocks between the high-speed serial interface and the one or more test cores.

26. The circuit recited in claim 25, wherein the one or more data conversion blocks include hold registers.

27. The circuit recited in claim 25, wherein the one or more data conversion blocks include a FIFO (first in, first out) buffer for compensating for asynchronous behavior.

28. The circuit recited in claim 24, wherein the control signal generator includes an FSM (finite state machine) system for generating one or more dynamic control signals including a scan enable signal.

29. The circuit recited in claim 24, wherein the clock generator/divider includes one or more PLLs (phase-locked loops).

30. The circuit recited in claim 24, wherein the one or more test cores are EDT (embedded deterministic test) cores.

31. The circuit recited in claim 24, wherein the high-speed serial interface includes a SerDes block that is not dedicated for scan testing, a PHY-logical and controller block for scan testing, and a multiplexing and de-multiplexing module between the SerDes block and the PHY-logical and controller block, the multiplexing and de-multiplexing module being able to divert data depending on an input signal.

32. The circuit recited in claim 24, further comprising one or more signature generators for detecting transmission errors.

33. The method recited in claim 1, wherein the first high-speed serial interface is an asynchronous high-speed serial interface.

34. The method recited in claim 33, further comprising:
    receiving a data sequence that defines a start to a data packet being received through the first unidirectional channel in the first high-speed serial interface.

35. The method recited in claim 1, wherein the first high-speed serial interface is a duplex interface.

36. The method recited in claim 1, wherein the data related to scan testing includes one or more of control data, clocking information, packet information, and error control mechanisms.

37. The method recited in claim 7, wherein the SerDes block comprises analog circuitry.

38. The method recited in claim 1, further comprising:
receiving a clock value through the first unidirectional channel in the first high-speed serial interface.

39. The circuit of claim 24, wherein the unidirectional transmit channel comprises a differential signal pair.

40. One or more computer-readable storage media storing circuit design information for implementing the circuit of claim 24.

41. One or more computer-readable storage media storing computer-executable instructions for causing a computer to create the circuit of claim 24.

42. A circuit, comprising:
a first asynchronously clocked high-speed serial interface configured to send scan data to and receive test responses from one or more test cores in a device under test for manufacturing defects;
a clock generator/divider configured to generate clock signals for the one or more test cores based on signals from the high-speed serial interface; and
a control signal generator configured to generate control signals for the one or more test cores.

43. The circuit of claim 42, further comprising:
a second asynchronously clocked high-speed serial interface configured to send scan data to and receive test responses from the one or more test cores, 44. The circuit of claim 42, wherein the one or more test cores consist of two or more test cores.

* * * * *

UNITED STATES PATENT AND TRADEMARK OFFICE
CERTIFICATE OF CORRECTION

PATENT NO.        : 8,726,112 B2                                    Page 1 of 1
APPLICATION NO.   : 12/506250
DATED             : May 13, 2014
INVENTOR(S)       : Rajski et al.

It is certified that error appears in the above-identified patent and that said Letters Patent is hereby corrected as shown below:

<u>In the Specification:</u>

In column 2, line 24, the words "designed the in a way" should read --designed in a way--.

In column 2, line 44, the words "take the" should read --takes the--.

In column 10, lines 10-15, the paragraph should read "Given the desired application data transfer rate, called the "payload", there are two schemes to determine the actual channel data rate and packet handling that typically implementations of the invention may be employed according to some implementations of the invention: a black-box channel scheme and a controlled packet scheme." should read --Given the desired application data transfer rate, there are two schemes to determine the actual channel data rate according to some implementations of the invention: a black-box channel scheme and a controlled packet scheme.--.

In column 18, line 38, the words "disclosure, a methods" should read --disclosure, methods--.

In column 18, line 47, the words "throughout" should read --throughput--.

Signed and Sealed this
Twenty-fourth Day of November, 2015

Michelle K. Lee
*Director of the United States Patent and Trademark Office*